(12) United States Patent
Beckhoff

(10) Patent No.: US 11,533,820 B2
(45) Date of Patent: Dec. 20, 2022

(54) BASE MODULE AND FUNCTIONAL MODULE FOR A CONTROL-CABINET SYSTEM

(71) Applicant: Beckhoff Automation GmbH, Verl (DE)

(72) Inventor: Hans Beckhoff, Verl (DE)

(73) Assignee: Beckhoff Automation GmbH, Verl (DE)

( * ) Notice: Subject to any disclaimer, the term of this patent is extended or adjusted under 35 U.S.C. 154(b) by 0 days.

(21) Appl. No.: 17/335,777

(22) Filed: Jun. 1, 2021

(65) Prior Publication Data

US 2021/0289653 A1 Sep. 16, 2021

Related U.S. Application Data

(63) Continuation of application No. PCT/EP2019/086344, filed on Dec. 19, 2019.

(30) Foreign Application Priority Data

Dec. 28, 2018 (DE) ...................... 10 2018 133 646.2

(51) Int. Cl.
*G06F 1/16* (2006.01)
*H05K 5/00* (2006.01)
(Continued)

(52) U.S. Cl.
CPC ......... *H05K 7/1465* (2013.01); *H05K 7/1468* (2013.01); *H05K 7/1477* (2013.01)

(58) Field of Classification Search
CPC .. H05K 7/1465; H05K 7/1468; H05K 7/1477; H05K 7/1467; H05K 7/1469; H05K 7/1471; H05K 7/1472
See application file for complete search history.

(56) References Cited

U.S. PATENT DOCUMENTS

| 789,671 A | 5/1905 | Reich | |
| 4,152,750 A * | 5/1979 | Bremenour | H05K 7/1465 361/796 |

(Continued)

FOREIGN PATENT DOCUMENTS

| CN | 1662128 A | 8/2005 |
| CN | 1684578 A | 10/2005 |

(Continued)

OTHER PUBLICATIONS

Office Action dated Feb. 25, 2022 in connection with Chinese patent application No. 20980086931.9, 22 pages including English translation.

(Continued)

*Primary Examiner* — Anthony M Haughton
(74) *Attorney, Agent, or Firm* — Dorsey & Whitney LLP

(57) ABSTRACT

A base module for a control-cabinet system includes a housing with a first housing face and further housing faces, the first housing face having a grid of openings. The housing has connection elements for functional modules, the connection elements each being arranged in the region of the openings of the first housing face, the connection elements comprising data connections, extra-low voltage connections and low-voltage connections. The data connections are interconnected by a data line of the base module and a field-bus connection is provided for the data line, where the data line is arranged within the housing. An extra-low voltage line and a low voltage line are arranged within the housing, where the extra-low voltage line is connected to the extra-low voltage connections and the low voltage line is connected to the low voltage connections.

20 Claims, 29 Drawing Sheets

(51) Int. Cl.
*H05K 7/00* (2006.01)
*H05K 7/14* (2006.01)

(56) References Cited

U.S. PATENT DOCUMENTS

| | | | |
|---|---|---|---|
| 5,493,194 | A | 2/1996 | Damiano et al. |
| 5,510,960 | A | 4/1996 | Rosen |
| 5,716,241 | A | 2/1998 | Hennemann et al. |
| 5,761,052 | A | 6/1998 | Wheeler-King et al. |
| 6,123,585 | A * | 9/2000 | Hussong ............ H05K 7/1472 439/652 |
| 6,172,875 | B1 | 1/2001 | Suzuki et al. |
| 6,172,877 | B1 | 1/2001 | Feye-Hohmann et al. |
| 6,881,101 | B2 | 4/2005 | Sichner et al. |
| 6,916,194 | B2 | 7/2005 | Sichner et al. |
| 7,021,974 | B2 | 4/2006 | Sichner et al. |
| 7,257,003 | B2 | 8/2007 | Ono |
| 7,277,286 | B2 | 10/2007 | Lee |
| 7,397,668 | B2 | 7/2008 | Sekine et al. |
| 7,616,453 | B2 | 11/2009 | Bergmann |
| 7,724,521 | B2 | 5/2010 | Nelson et al. |
| 7,753,740 | B2 | 7/2010 | Carolis et al. |
| 7,933,104 | B2 | 4/2011 | Bauer et al. |
| 7,967,646 | B2 | 6/2011 | Carolis et al. |
| 8,891,220 | B2 | 11/2014 | Shimizu et al. |
| 9,112,318 | B2 | 8/2015 | Cech et al. |
| 9,456,518 | B2 | 9/2016 | Bury et al. |
| 9,474,187 | B2 | 10/2016 | Nelson et al. |
| 9,936,598 | B2 | 4/2018 | Gruber |
| 9,992,898 | B2 | 6/2018 | Tsutsumi et al. |
| 10,140,226 | B2 | 11/2018 | Veil et al. |
| 2004/0201972 | A1 | 10/2004 | Walesa |
| 2005/0185381 | A1 * | 8/2005 | Ono ............... H05K 5/061 312/223.1 |
| 2006/0126277 | A1 | 6/2006 | Tomkowiak |
| 2006/0136622 | A1 | 6/2006 | Rouvelin et al. |
| 2006/0259670 | A1 * | 11/2006 | Meinke ............ H05K 7/1477 710/100 |
| 2007/0066147 | A1 | 3/2007 | Braunlich et al. |
| 2009/0021920 | A1 * | 1/2009 | Hund ............... H01L 23/057 361/728 |
| 2009/0309467 | A1 | 12/2009 | Nelson et al. |
| 2009/0310312 | A1 | 12/2009 | Wayman et al. |
| 2010/0103627 | A1 | 4/2010 | Nelson et al. |
| 2011/0131455 | A1 | 6/2011 | Law et al. |
| 2011/0164350 | A1 | 7/2011 | Kanaya et al. |
| 2011/0256749 | A1 * | 10/2011 | Bayerer ............ H01R 12/585 439/345 |
| 2012/0206881 | A1 | 8/2012 | Nelson et al. |
| 2012/0243623 | A1 | 9/2012 | Kisakuerek |
| 2013/0336359 | A1 | 12/2013 | Zink |
| 2013/0342152 | A1 | 12/2013 | Maeda et al. |
| 2014/0160679 | A1 | 6/2014 | Kelty |
| 2014/0307367 | A1 | 10/2014 | Maeda et al. |
| 2015/0257286 | A1 * | 9/2015 | Sichmann ......... H05K 5/0291 361/732 |
| 2016/0037660 | A1 | 2/2016 | Budde et al. |
| 2016/0254612 | A1 | 9/2016 | Andrei et al. |
| 2016/0320761 | A1 | 11/2016 | Kirsamer et al. |
| 2016/0349721 | A1 | 12/2016 | Kang |
| 2017/0374756 | A1 | 12/2017 | Leen et al. |
| 2018/0069359 | A1 | 3/2018 | Müller et al. |
| 2021/0289654 | A1 | 9/2021 | Beckhoff |
| 2021/0298189 | A1 | 9/2021 | Siegenbrink et al. |
| 2021/0385964 | A1 | 12/2021 | Beckhoff et al. |

FOREIGN PATENT DOCUMENTS

| | | |
|---|---|---|
| CN | 101080858 A | 11/2007 |
| CN | 101192056 A | 6/2008 |
| CN | 101690019 A | 3/2010 |
| CN | 102047349 B | 5/2013 |
| CN | 103858281 A | 6/2014 |
| CN | 204014380 U | 12/2014 |
| CN | 104662844 A | 5/2015 |
| CN | 105580214 A | 5/2016 |
| CN | 105684563 A | 6/2016 |
| CN | 105746006 A | 7/2016 |
| CN | 105101753 B | 8/2017 |
| CN | 208400835 U | 1/2019 |
| DE | 4140611 C1 | 5/1993 |
| DE | 19525438 A1 | 1/1997 |
| DE | 19651961 A1 | 6/1998 |
| DE | 19748429 A1 | 5/1999 |
| DE | 19748531 A1 | 5/1999 |
| DE | 19902745 A1 | 8/2000 |
| DE | 19923569 A1 | 11/2000 |
| DE | 10006879 A1 | 8/2001 |
| DE | 4437316 C2 | 12/2001 |
| DE | 69715868 T2 | 10/2002 |
| DE | 10148470 A1 | 4/2003 |
| DE | 20211002 U1 | 12/2003 |
| DE | 102004018115 A1 | 11/2005 |
| DE | 102006056001 A1 | 6/2008 |
| DE | 102009005546 A1 | 12/2009 |
| DE | 102006049631 B4 | 3/2011 |
| DE | 102011110184 A1 | 2/2013 |
| DE | 202013003925 U1 | 6/2013 |
| DE | 102012213281 A1 | 1/2014 |
| DE | 102012021055 A1 | 4/2014 |
| DE | 102013202591 A1 | 8/2014 |
| DE | 102016000126 A1 | 7/2016 |
| DE | 112013007698 A5 | 9/2016 |
| DE | 202017104591 U1 | 11/2018 |
| DE | 102018133646 A1 | 7/2020 |
| DE | 102018133647 A1 | 7/2020 |
| DE | 102018133657 A1 | 7/2020 |
| DE | 102019106082 B4 | 6/2021 |
| EP | 0236711 A2 | 9/1987 |
| EP | 0661915 A1 | 7/1995 |
| EP | 0323579 B1 | 3/1997 |
| EP | 0895708 B1 | 10/1999 |
| EP | 1258957 A1 | 11/2002 |
| EP | 1269809 B1 | 10/2004 |
| EP | 1595313 B1 | 6/2007 |
| EP | 1593312 B1 | 8/2008 |
| EP | 1668969 B1 | 10/2009 |
| EP | 2111088 A2 | 10/2009 |
| EP | 2183751 A1 | 5/2010 |
| EP | 1383368 B1 | 12/2010 |
| EP | 2642602 A1 | 9/2013 |
| EP | 2642603 A1 | 9/2013 |
| EP | 2793540 A2 | 10/2014 |
| EP | 2986093 A1 | 2/2016 |
| EP | 3018983 A2 | 5/2016 |
| EP | 3019983 A1 | 5/2016 |
| JP | 2014529781 A | 11/2014 |
| JP | 2016502266 A | 1/2016 |
| JP | 2016092219 A | 5/2016 |
| JP | 2016534422 A | 11/2016 |
| JP | 2018514904 A | 6/2018 |
| JP | 6388770 B2 | 8/2018 |
| WO | 2004057937 A1 | 7/2004 |
| WO | 2008101513 A1 | 8/2008 |
| WO | 2009014530 A1 | 1/2009 |
| WO | 2015063292 A1 | 5/2015 |
| WO | 2015090345 A1 | 6/2015 |
| WO | 2020136010 A2 | 7/2020 |
| WO | 2020136081 A1 | 7/2020 |
| WO | 2020136084 A1 | 7/2020 |
| WO | 2020182877 A1 | 9/2020 |

OTHER PUBLICATIONS

Office Action dated Feb. 28, 2022 in connection with Chinese patent application No. 201980086815.7, 24 pages including English translation.

EP9128-Ether_CAT-Sternverteiler in Schutzart IP67—Version 2.2.0, Beckhoff GmbH, Jul. 13, 2015, 45 pages.

Office Action dated Nov. 30, 2021 in connection with European U.S. Appl. No. 19821065.0, 18 pages including English translation.

(56) References Cited

OTHER PUBLICATIONS

Partial Search Report dated Mar. 13, 2020 in connection with International Patent Application No. PCT/EP2019/084699, 27 pages including English translation.
International Search Report and Written Opinion dated Jun. 24, 2020 in connection with International Patent Application No. PCT/EP2019/084699, 37 pages including English translation.
Examination Report dated Aug. 13, 2019 in connection with German patent application No. DE 10 2018 133 657.8, 16 pages including English translation.
International Search Report and Written Opinion dated Jun. 4, 2020 in connection with International Patent Application No. PCT/EP2020/056494, 31 pages including translation.
International Preliminary Report on Patentability dated Jul. 14, 2021 in connection with International Patent Application No. PCT/EP2020/056494, 33 pages including translation.
Japanese Office Action dated Jan. 31, 2022 in connection with Japanese patent application No. 2021-53787, 4 pages including English translation.
"Backplane," Wikipedia, 6 pages, <https://en.wikipedia.org/wiki/Backplane#Active_versus_passive_...>.
"Festo and Rockwell: A partnership built on a shared commitment," <https://www.festo.com/us/en/e/iot-technologies/festo-and-rockwell...> 6 pages.
"I/O-System" Hans Turek GmbH Co. KG, 10 pages, <https://www.turck.de/de/productgroup/Feldbustechnik...>.
"Passive Backplanes," Advantech, 1 page, <https://www.advantech.eu/products/passive-backplanes/sub_1-2jkogc>.
"Schaltschrank," Wikipedia, <https://de.wikipedia.org/w/index.php?title=Schaltschrank&oldid=...>, 9 pages with English translation.
"Verfahrenstechnik," Wikipedia, <https://de.wikipedia.org/w/index.php?title+Verfahrenstechnik...>, 21 pages including English translation.
"Werkzeugmaschine," Wikipedia, <https://de.wikipedia.org/w/index.php?title_Werkzeugmaschine...> 49 pages including English translation.
"Simatic ET 200, The I/O system for both inside and outside the control cabinet," Siemens, (2015) 18 pages including English translation.
Graphite Module: Crimson Control, Red Lion Automation Series, "IEC 61131 Logic Control Programming," 2016, 2 pages.
Red Lion Graphite Core Controller, Red Lion Automation Series, "Rugged Standalone Industrial Controller," 2016, 2 pages.
"35 solutions worth seeing at SPS IPC Drives," Vogel Business Media, 2017, 3 pages including English translation.
Red Lion Graphite HMIs, Red Lion Automation Series, "Rugged Operator Panels with Modular I/O," 2017, 4 pages.
"Simatic, ET 200pro Interfacemodul IM 154-8 CPU," Siemens, Dec. 2006, 280 pages including partial English translation.
International Search Report and Written Opinion dated Mar. 27, 2020 in connection with International Patent Application No. PCT/EP2019/086344, 32 pages including English translation.
International Search Report and Written Opinion dated Apr. 1, 2020 in connection with International Patent Application No. PCT/EP2019/086359, 30 pages including English translation.
Examination report dated Jun. 8, 2019 in connection with German patent application No. 10 2018 133 646.2, 18 pages including English translation.
Allen-Bradley, "FlexArmor" 1798 Technical Data, Aug. 2001, 20 pages.
Examination Report dated Aug. 8, 2019 in connection with German patent application No. DE 10 2018 133 647.0, 18 pages including English translation.
"Simatic, Dezentrales Peripheriesystem ET 200pro," Siemens, Sep. 2016, 517 pages including partial English translation.
Office Action dated Jun. 8, 2022 in connection with Chinese Patent Application No. 2022080020520.2, 9 pages including English translation.
Office Action dated Jun. 27, 2022 in connection with Japanese patent application No. 2021-537884, 17 pages including English translation.
First Office Action dated Mar. 24, 2022 in connection with Chinese patent application No. 201980086871.0, 10 pages including English translation.
Office Action issued in Japanese Patent Application No. 2021-537936, dated Aug. 16, 2022, 18 pages including 12 pages of English translation.

\* cited by examiner

BASE MODULE AND FUNCTIONAL MODULE FOR A CONTROL-CABINET SYSTEM

CROSS-REFERENCE TO RELATED APPLICATIONS

The present application is a continuation of International Patent Application PCT/EP2019/086344, filed 19 Dec. 2019, entitled BASE MODULE AND FUNCTIONAL MODULE FOR A SWITCH CABINET SYSTEM, which claims priority of German patent application DE 10 2018 133 646.2, filed 28 Dec. 2018, entitled BASIMODUL UND FUNKTIONSMODUL FOR EIN SHALTSCHRANKSYSTEM, each of which is incorporated by reference herein, in the entirety and for all purposes.

FIELD

The present invention relates to a base module and a functional module for a control-cabinet system. Furthermore, the present invention relates to a control-cabinet system comprising a base module and one or more functional modules.

BACKGROUND

In modular field-bus systems, which may e.g. be used in automation systems, functional modules may be connected directly to one another or each may be connected to a base module. In the latter variant, data connections and extra-low voltage connections may be provided at the base module to which the functional modules are connected. This allows for a simple structure of the modular field-bus system. In this context, the functional modules may take over a variety of functionalities and be embodied, for example, as input modules, output modules, PLC control modules, motor control modules or power supply modules. A field bus provides both a communication option as well as a power supply with an extra-low voltage. Such a field-bus system is disclosed in DE 100 06 879 A1. The communication option and the power supply may also be provided by separate connections.

The disadvantage of this field-bus system is therefore that a separate mains connection must be provided for functional modules such as a motor controller, for which a higher voltage is required. This complicates the wiring and installation of such a field-bus system if the functionality of a control cabinet is to be provided by the field-bus system. A control cabinet may contain the electrical and electronic components of a process plant, a machine tool or a production facility that are not located directly in the machine (cf.http://de.wikipedia.org/wiki/Schaltschrank).

SUMMARY

The invention provides a base module and a functional module for a control-cabinet system, by which the functionalities of a switch cabinet may be provided. The invention further provides a control-cabinet system comprising a base module and one or more functional modules.

According to a first aspect, a base module for a control-cabinet system comprises a housing having a first housing face and further housing faces. The first housing face has a grid of openings. In addition, the housing has connection elements for functional modules, each of which is arranged in the area of the openings of the first housing face. The connection elements include data connections, extra-low voltage connections and low-voltage connections. The data connections are interconnected by a data line of the base module, wherein a field bus connection may be provided for the data line and wherein the data line is arranged within the housing. Further, an extra-low voltage line and a low voltage line are respectively arranged within the housing, wherein the extra-low voltage line is connected to the extra-low voltage connections and the low voltage line is connected to the low voltage connections.

A field bus may be provided via the data connections, which may be used for communication between the base module and the functional modules. The field bus may be embodied as a field bus defined in the IEC 61158 standard, in particular as EtherCAT or EtherCAT P.

Extra-low voltages are in this context understood to be electrical voltages up to 50 volts AC and/or 120 volts DC, in particular up to 25 volts AC and/or 60 volts DC. This definition of extra-low voltage may be taken from the IEC60449 standard. Low voltages are in this context understood to be electrical voltages above the extra-low voltage and up to 1000 volts AC and/or 1500 volts DC. Furthermore, it may be intended to provide a supply voltage for communication electronics by the data line. This supply voltage may be in the range of a few volts.

A maximum current strength that can be provided through the low voltage connections may be 40 amps. A maximum current strength that may be provided through the low voltage connections may be 75 amps.

The low-voltage line and low-voltage connections may provide a low voltage for the functional modules. This means that the functionalities traditionally provided by a control cabinet may be provided with such a base module and associated functional modules. Further advantages are the reduced wiring effort and the simpler planning or conceptual design of such a control-cabinet system.

The connection elements arranged in each case in the area of the openings of the first housing face may be arranged inside of the housing and be accessible for module connection elements through the openings. Alternatively, the connection elements may also be guided through the openings and arranged outside of the housing. Furthermore, the openings may be closed by the connection elements so that the openings form openings through the first housing face, wherein the connection elements is guided through and closes the openings.

The housing may be embodied as a bar-pressed profile or as a die-cast housing. The housing materials may be metals such as aluminum, steel, stainless steel or zinc, and the housing may additionally be coated. Alternatively, the housing may also be made of plastic.

The housing may consist of several individual parts which are connected to one another by fastening elements, for example screws, or by welding or soldering. Furthermore, a seal may be provided between the individual parts to make the housing inaccessible to liquids and/or contact between the individual parts.

The data line, the extra-low voltage line and the low voltage line may be arranged within the housing on one or more circuit boards. In particular, one circuit board may be provided for the data line and the extra-low voltage line and another circuit board may be provided for the low voltage line. The data line may have a plurality of cores. The extra-low voltage line may have a plurality of cores. The low voltage line may have a plurality of cores. If the data line, the extra-low voltage line and the low-voltage line, respectively, are arranged on a circuit board, the cores may be implemented as conductor paths on the respective circuit board. Furthermore, grooves may be arranged on one or more inner sides of the housing into which the circuit boards may be inserted. Alternatively or additionally, the circuit boards may be screwed to the housing.

According to a second aspect, a functional module comprises a module housing, an electronic circuit and a module connection element. The module connection element is set up to engage in connection elements of the base module, in particular in the data connections and the extra-low voltage connections. The module housing has a first module housing face and further module housing faces. It may be provided that the first module housing face comprises a module housing opening through which the module housing is accessible. It may further be provided that the first module housing face is planar. In particular, a metallic component of the module housing may have the planar first module housing face with the module housing opening.

The connection elements or the module connection element may be embodied as a plug connector, in particular the connection elements may be embodied as a socket and the module connection element as a plug, or vice versa.

Alternatively, the connection elements may have a cable insert and a clamp connection.

According to a third aspect, a control-cabinet system comprises a base module and at least one functional module, wherein the functional module may be arranged on the first housing face of the base module. The functional module covers at least one of the openings of the housing of the base module.

With a plurality of functional modules, the functionality of a control cabinet may be provided, wherein the functional modules are not directly connected to one another, but a connection of the functional modules is provided via the base module.

EXAMPLES

In an embodiment of the base module, a plurality of data connections and a plurality of extra-low voltage connections are arranged on a data and extra-low voltage circuit board, respectively. A plurality of low voltage connections are arranged on a low voltage circuit board. The data line and the extra-low voltage line are provided by the data and extra-low voltage circuit board. The low voltage line is provided by the low voltage circuit board.

In another embodiment of the base module, two channels are arranged within the housing, separated from each other by a first partition. The data connections and the extra-low voltage connections are assigned to the first channel, and the low voltage connections are assigned to the second channel. In particular, a first circuit board with the data connections and the extra-low voltage connections may be arranged in the first channel, while a second circuit board with the low-voltage connections may be arranged in the second channel. The first circuit board may in this context be referred to as the data and extra-low voltage circuit board. The second circuit board may be referred to as the low voltage circuit board.

It may be provided that data connections and extra-low voltage connections are also arranged in the second channel as an alternative to the low-voltage connections or in addition to the low-voltage connections. This may also be carried out by arranging a data and extra-low voltage circuit board in the second channel.

In an embodiment of the base module, the housing has a third channel that is separated from the first or second channel by a second partition. Cooling air may be guided via the third channel. Furthermore, an additional circuit board may be provided in the third channel.

Alternatively or additionally, data connections and/or extra-low voltage connections and/or low-voltage connections may also be provided in the third channel. These may also be provided by a data and extra-low voltage circuit board and a low voltage circuit board respectively.

The channels allow a systematic structure of the base module and different functionalities of the base module may be assigned to different channels.

In one embodiment of the base module, the first housing face is flat. This allows functional modules, which are also flat, to be easily attached to the base module, thereby providing a control-cabinet system which is easy to assemble.

In one embodiment of the base module, the low-voltage connections each have a seven-pin connector, which may be embodied as a plug or a as socket. The associated module connection element of the functional module may then be embodied as a socket or plug. The seven-pin connector has a first contact, a second contact and a third contact for an AC phase in each case, a fourth contact for an AC neutral conductor, a fifth contact for a protective conductor, as well as a sixth contact and a seventh contact for a DC voltage. A module connection element may be embodied as a five-pin connector having an eighth contact, a ninth contact, and a tenth contact for each of the three AC phases, an eleventh contact for the AC neutral conductor, and a twelfth contact for the protective conductor. In addition, the module connection element may have a thirteenth contact and a fourteenth contact for the DC voltage and is then embodied as a seven-pin connector. Alternatively, the module connection element may only comprise the twelfth contact for the protective conductor and the thirteenth contact and the fourteenth contact for the DC voltage and is then embodied as a three-pin connector.

This allows a universal connector to be provided on the base module side. The module connection element is embodied in such a way that the contacts for the AC voltage and/or the contacts for the DC voltage may be engaged, depending on whether the functional module requires DC voltage, AC voltage or both DC voltage and AC voltage.

In an embodiment of the base module, the data connections and extra-low voltage connections are arranged below the openings within the housing. This allows unintentional contact of the data connections and extra-low voltage connections to be partially prevented.

In another embodiment, the base module has a safety circuit. The safety circuit is set up to switch off one of the extra-low voltage connections and/or one of the low-voltage connections. For this purpose, the safety circuit may be connected to the data line and access the field bus. This means that safety-relevant functions may also be controlled by the control-cabinet system comprising the base module and functional module. Safety-relevant functions may include, for example, a safe shutdown of drives with corresponding STO (Safe Torque Off) certified inputs, a two-channel shutdown of 24 VDC actuators and/or a two-channel shutdown of positive-opening relays.

In another embodiment, the base module has a monitoring circuit. The monitoring circuit is set up to determine an environmental parameter, in particular a tilt and/or a vibration. Furthermore, the monitoring circuit is set up to switch off one of the extra-low voltage connections and/or one of the low-voltage connections if the ambient parameter is outside a predetermined value range. In particular, the monitoring circuit may be arranged to disconnect all of the extra-low voltage connections and/or low voltage connections. Alternatively, the monitoring circuit may be set up to output a warning message if an installation position determined via the inclination does not conform to installation specifications. Alternatively or additionally, the safety circuit may be set up to switch off one of the extra-low voltage connections and/or one of the low-voltage connections, in particular all extra-low voltage connections and/or low-voltage connections, if an installation position determined via the inclination does not conform to installation specifications. This may enable operation of the base module within safe operating parameters, wherein shutdown of the base module occurs outside of the safe operating parameters. An alternative or additional environmental parameter may be a temperature, wherein the base module may be protected against overheating. Another alternative or additional environmental parameter may be a humidity, wherein the base module may be protected against voltage flashovers.

In an embodiment of the base module, this has housing connections for data and/or at least one extra-low voltage and/or at least one low-voltage. It may be provided that the housing connection for data is connected to the data line, the housing connection for extra-low voltage is connected to the low voltage line and/or the housing connection for low voltage is connected to the low voltage line. The housing connection or connections may be arranged at the first housing face or at a further housing face. The housing connections may thus serve as feed connections for data, extra-low voltage or low voltage. Alternatively, the power may be fed in via a corresponding functional module, which is embodied as a feed-in module.

Furthermore, housing connections for data and/or extra-low voltage and/or low voltage may be provided, which may be used for forwarding data, extra-low voltage or low voltage to a further base module. Alternatively, the forwarding may also take place via a corresponding functional module embodied as a forwarding module. With the forwarding module, the data, the extra-low voltage and/or the low voltage may be forwarded from a first base module to a second base module. This is particularly advantageous if a base module does not have enough connection elements for all the required functionalities. With the forwarding module, a control-cabinet system consisting of base modules and functional modules may thus be embodied in a modularly expandable manner.

In particular, it is possible to equip the first base module with a forwarding module and the second base module with a feed-in module, and to connect the forwarding module and the feed-in module with an external data line, which may be embodied as a field-bus line, an external extra-low voltage line and an external low-voltage line. This allows a plurality of functional modules to be integrated into the control-cabinet system. The number of base modules within the control-cabinet system may be limited by maximum currents and/or maximum line lengths.

In an embodiment, the base module has a seal that is arranged circumferentially around an opening or circumferentially around several openings. The seal may be used to seal the control-cabinet system consisting of base module and functional modules, wherein the control-cabinet system consisting of base module and functional modules may be assigned a so-called IP protection class, e.g. IP67. Alternatively or additionally, a seal arranged on the functional modules may also be provided.

In another embodiment of the base module, the housing has a pressure-equalizing membrane. This allows an air pressure inside the housing to be equalized to an air pressure outside the housing without rendering the housing leaky to liquids and/or dust.

In an embodiment, the base module has a grounding bar. The grounding bar may serve as a functional ground for other components connected to the functional modules. Furthermore, the grounding bar may be connected to a functional ground of the extra-low voltage line and/or low-voltage line.

In another embodiment of the functional module, the module housing has a first module housing face and further module housing faces. The first module housing face has a module housing opening and is flat. In particular, a metallic component of the module housing may have the flat first module housing face with the module housing opening. In an embodiment of the functional module, the module connection element is further configured to engage the low voltage connections.

In an embodiment of the control-cabinet system, a plurality functional modules are attached to the base module. The functional modules cover the openings of the housing. The control-cabinet system is embodied to be dust-tight and water-tight, for example according to IP67. The sealing of the control-cabinet system may be achieved by at least one seal at the base module and/or at least one seal at the functional module.

BRIEF DESCRIPTION OF THE DRAWINGS

The invention will be discussed in more detail below with respect to examples of embodiments and with reference to figures. Here, in a schematic illustration in each case.

DETAILED DESCRIPTION

Figure 1:
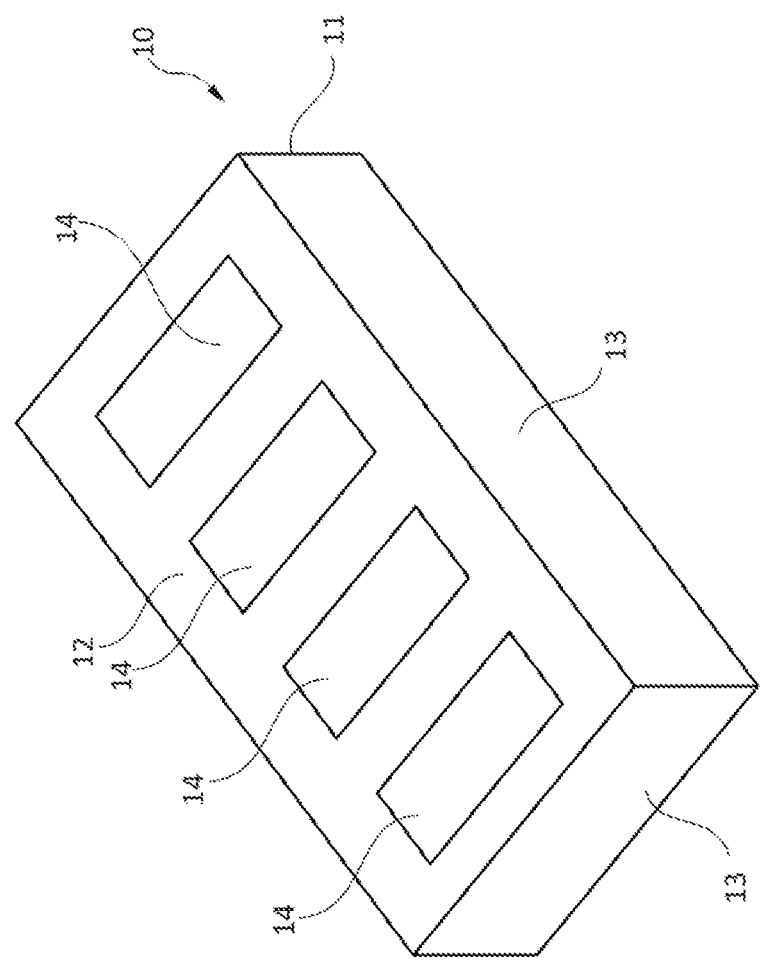
FIG. 1 shows an isometric view of a base module.

FIG. 1 shows an isometric view of a base module 10. The base module 10 comprises a housing 11 with a first housing face 12 and further side walls 13. The first housing face 12 has a grid of openings 14, in this case four adjacent openings 14 in a 1×4 arrangement. Thus, the openings 14 are in a row. Multiple rows of openings 14 may also be provided, as well as more or less than four openings 14 in a row. The first housing face 12 may be flat, as shown in FIG. 1.

Figure 2:
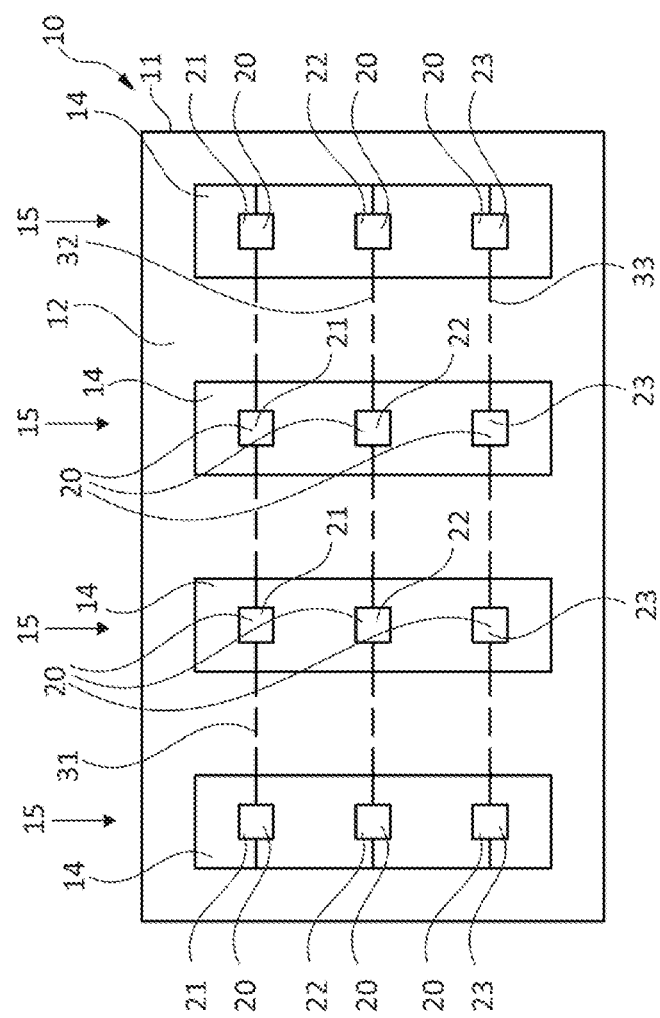
FIG. 2 shows a top view of the base module.

FIG. 2 shows a top view of the first housing face 12 of the base module 10 of FIG. 1. Connection elements 20 are accessible through the openings 14, the connection elements 20 being suitable for connecting functional modules to the base module 10. The connection elements 20 are arranged in the area of the openings 14. The connection elements 20 comprise data connections 21, extra-low voltage connections 22 and low-voltage connections 23. The data connections 21 are interconnected via a data line 31. A field bus may be provided via the data line 31. The extra-low voltage connections 22 are interconnected via an extra-low voltage line 32. The low-voltage connections 23 are interconnected via a low-voltage line 33. Since the data line 31, the extra-low voltage line 32 and the low voltage line 33 are covered by the first housing face 12 outside of the openings 14, they are shown there by dashed lines.

Each opening 14 is assigned to a slot 15. The slots 15 are embodied to accommodate functional modules. Each slot 15 has a data connection 21, an extra-low voltage connection 22 and a low-voltage connection 23. Functional modules may cover one slot 15, but also several slots 15. On the one hand, functional modules that cover several slots 15 may have more installation space, making a larger width of the functional module necessary. On the other hand, additional module connections may be implemented in this way, e.g. by engaging with the data connections 21 of two slots 15.

A low voltage may be provided to functional modules via the low voltage line 33 and low voltage connections 23. Thus, the functionalities traditionally provided by a control cabinet may be provided with such a base module 10 and associated functional modules.

The data line 31, the low voltage line 32 and the low voltage line 33 may each have two or more cores, although only one line is shown in FIG. 2 and also in the following figures.

The connection elements 20 arranged in each case in the area of the openings 14 of the first housing face 12 are arranged inside the housing 11 and accessible for module connection elements through the openings 14. In FIG. 1, the connection elements, i.e. data connections, extra-low voltage connections as well as low-voltage connections, are arranged inside the housing 11.

The housing 11 may be embodied as a bar-pressed profile or as a die-cast housing. The housing material may be metals such as aluminum, steel, stainless steel or zinc, and the housing may also be coated. Plastic may be used as an alternative housing material.

The housing 11 may consist of several individual parts which are connected to one another by fastening elements, for example screws, or by welding or soldering. Furthermore, a seal may be provided between the individual parts to make the housing 11 inaccessible to water and/or contact between the individual parts.

Figure 3:
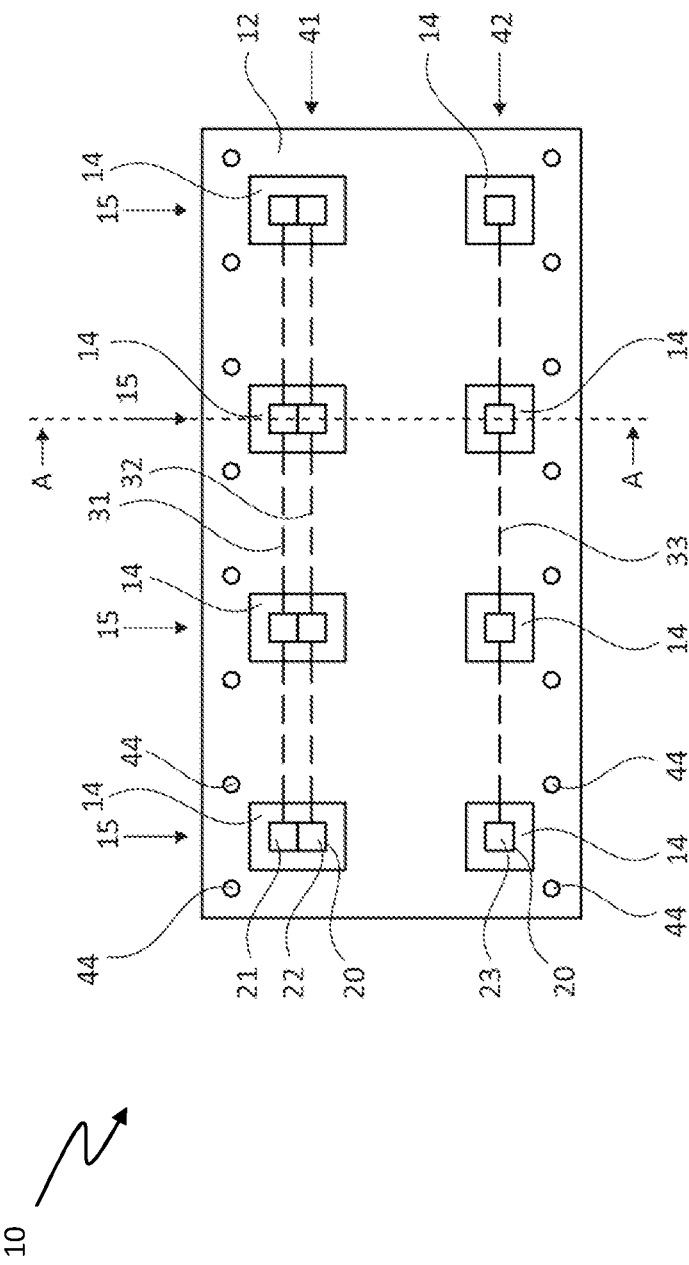
FIG. 3 shows a top view of another base module.

FIG. 3 shows a top view of a further base module 10 which corresponds to the base module of FIGS. 1 and 2, provided that no differences are described below. The grid of openings 14 of the base module 10 corresponds to a 2×4 arrangement, with two openings 14 each being assigned to a slot 15. A combined connection element 20 comprises the data connection 21 and the extra-low voltage connection 22 and is assigned to a first row 41 of openings 14 of the 2×4 arrangement. A further connection element 20 provides the low-voltage connection 23 and is assigned to a second row 42 of openings 14.

Four threaded holes 44 are additionally assigned to each slot 15. The threaded holes 44 are embodied as blind holes. Functional modules may be fastened to the threaded holes 44 by screws. The threaded holes 44 do not penetrate the housing 11 so that neither water nor dust may enter the interior of the housing 11 via the threaded holes 44.

A wall thickness of the housing 11 may be more than five millimeters, in particular seven or more millimeters, so that the threaded holes 44 are deep enough to hold a screw securely without having to break through the housing 11.

More than four openings 14 may be arranged in a row 41, 42 of the grid of openings 14, as well as more than two rows of openings 14.

Figure 4:
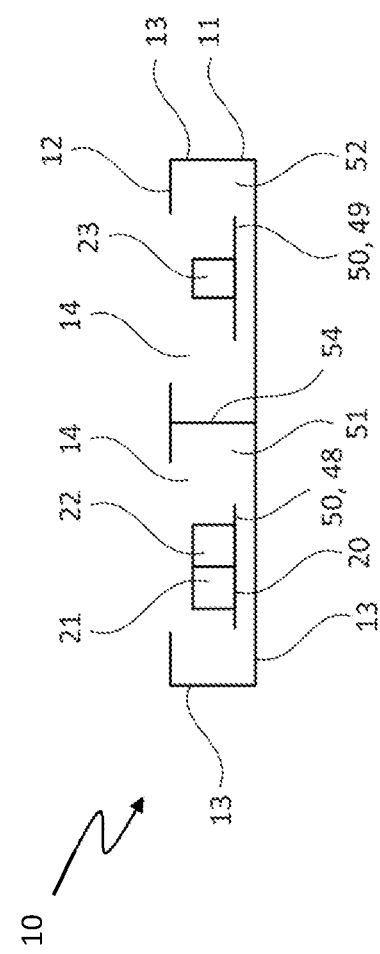
FIG. 4 shows a cross-section through the further base module.

FIG. 4 shows a cross-section through the base module 10 of FIG. 3 at the location marked A in FIG. 3. Within the housing 11, the base module 10 has a first channel 51 and a second channel 52. Both channels 51, 52 are each accessible through an opening 14, with the data connection 21 and the extra-low voltage connection 22 being arranged in the first channel 51 and the low voltage connection 23 being arranged in the second channel 52. The first channel 51 and the second channel 52 are separated from each other by a first partition 54. All of the data connections 21 and all of the extra-low voltage connections 22 are arranged in the first channel 51, and all of the extra-low voltage connections 23 are arranged in the second channel 52. The data connections 21 and extra-low-voltage connections 22 are arranged on a circuit board 50, which is configured as a data and extra-low voltage circuit board 48 and is arranged in the first channel 51. The data and extra-low voltage circuit board 48 also provides the data line 31 and the low voltage line 32. The low voltage connections 23 are arranged on a circuit board 50, which is configured as a low voltage circuit board 49 and is arranged in the second channel 52. The low-voltage circuit board 49 provides the low-voltage line 33.

Figure 5:
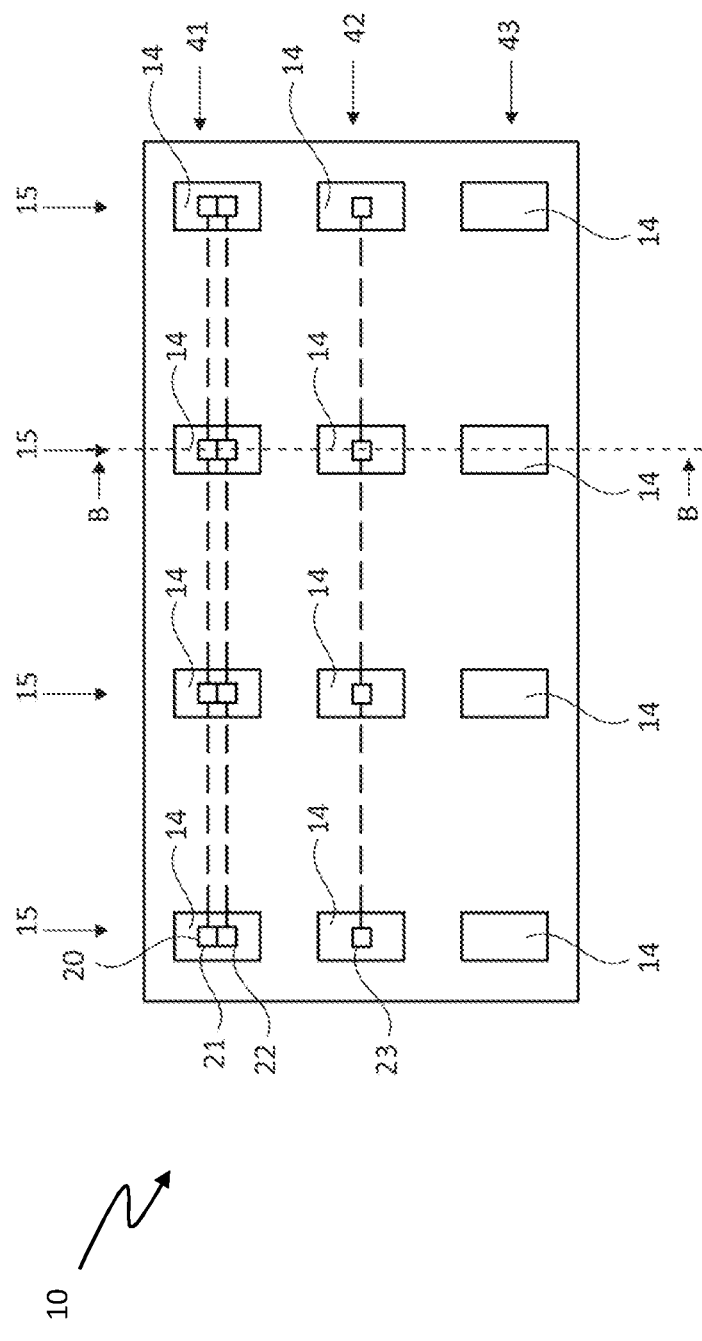
FIG. 5 shows a top view of another base module.

FIG. 5 shows a top view of a further base module 10, which corresponds to the base module of FIGS. 3 and 4, unless differences are described in the following. The grid of openings 14 of the base module 10 corresponds to a 3×4 arrangement, with three openings 14 each being assigned to a slot 15. A combined connection element 20 comprises the data connection 21 and the extra-low voltage connection 22 and is assigned to a first row 41 of openings 14 of the 3×4 arrangement. A further connection element 20 provides the low voltage connection 23 and is associated with a second row 42 of openings 14 of the 3×4 arrangement. A third row 43 of openings does not have a connection element. Cooling air for functional modules, for example, may be routed via the third row 43 of openings. Alternatively, it is conceivable that combined connection elements 20, each with a data connection 21 and an extra-low voltage connection 22 and/or, analogously to the second channel 42, further connection elements 20, each providing a low-voltage connection 23, are also arranged in the third row 43.

No threaded holes 44 are shown in FIG. 5. However, these may be provided in analogy to FIG. 3, as well as in the still following embodiment examples. Four threaded holes 44 may be provided per slot 15, but also four threaded holes 44 per opening 14.

More than four openings 14 may be arranged in a row 41, 42, 43 of the grid of openings 14, as well as more than three rows of openings 14.

Figure 6:
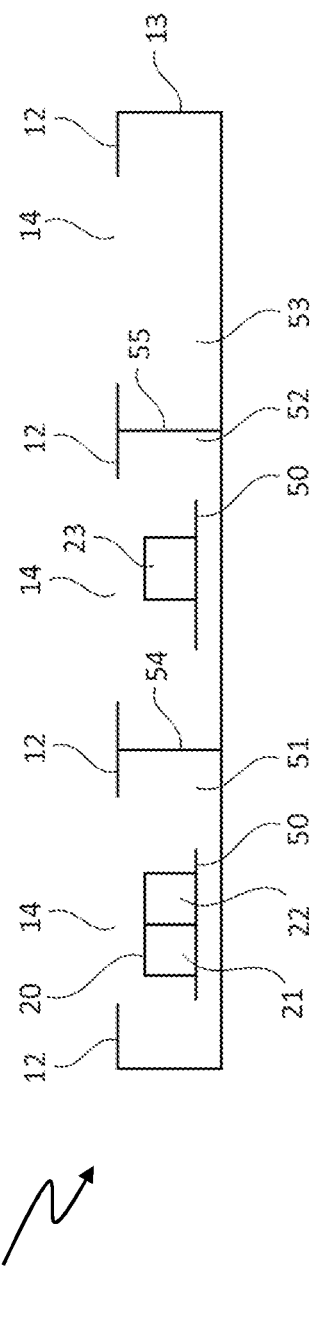
FIG. 6 shows a cross-section through the further base module.

FIG. 6 shows a cross-section through the base module 10 of FIG. 5 at the location marked B in FIG. 5. The base module 10 has a third channel 53 inside the housing 11 in addition to the first channel 51 and the second channel 52. The channels 51, 52, 53 are each accessible through an opening 14. The second channel 52 and the third channel 53 are separated from one another by a second partition 55. The third channel 53 may in particular be used to provide cooling air for functional modules. Alternatively or additionally, a circuit board with connection elements may also be arranged in the third channel 53, analogously to the circuit boards arranged in the first channel 51 or second channel 52.

The material of the housing 11 of the embodiments of FIGS. 4 and 6 may comprise a metal. The partition walls 54, 55 may thereby be made of the material of the housing 11. It is also possible to manufacture the housing 11 of metal and the partition walls 54, 55 of plastic, or to make the housing 11 of plastic and the partition walls 54, 55 of metal.

Figure 7:
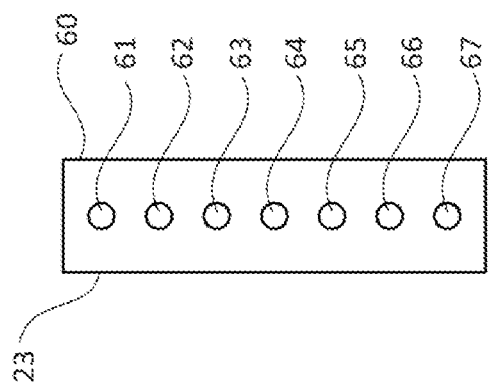
FIG. 7 shows a first connector of the low-voltage connection.
Figure 8:
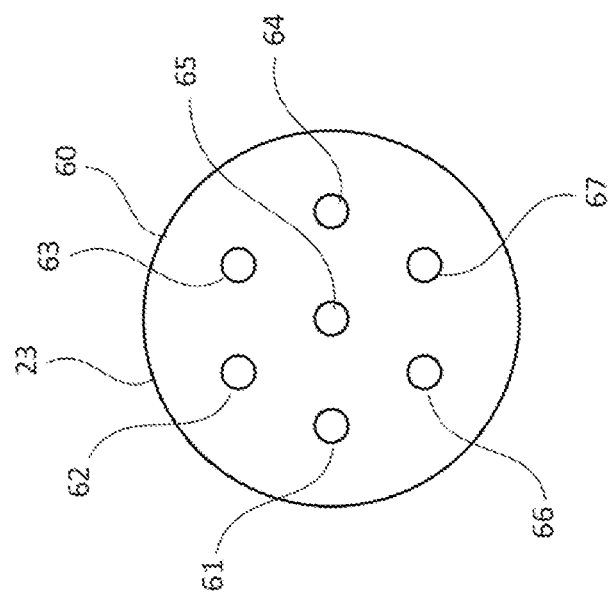
FIG. 8 shows a second connector of the low-voltage connection.

FIG. 7 and FIG. 8 each show an example of a seven-pin connector 60 which may be a socket and forms a low-voltage connection 23. The connector 60 comprises a first contact 61, a second contact 62, and a third contact 63, each for an AC phase of a three-phase AC current. Further, the connector 60 has a fourth contact 64 for an AC neutral conductor, a fifth contact 65 for a protective conductor, and a sixth contact 66 and a seventh contact 67 for a DC voltage. A functional module may have a module connection element configured as a connector. Depending on the voltage supply required by the functional module, the plug may engage with the first contact 61, the second contact 62, the third contact 63, the fourth contact 64, and the fifth contact 65 if a three-phase AC voltage is required by the functional module. If only one phase of AC voltage is required, the first contact 61 or the second contact 62 or the third contact 63 may be engaged in addition to the fourth contact 64 and the fifth contact 65. If the functional module requires DC voltage, the fifth contact 65, the sixth contact 66, and the seventh contact 67 may be engaged. If both DC voltage and AC voltage are required by the functional module, the corresponding contacts may also be engaged with, in particular all first to seventh contacts 61, 62, 63, 64, 65, 66, 67 if all three AC phases are used, or the fourth contact 64, the fifth contact 65, the sixth contact 66, the seventh contact 67 as well as the first contact 61 or the second contact 62 or the third contact 63 if only one of the three AC phases is used.

In FIG. 7, the first to seventh contacts 61, 62, 63, 64, 65, 66, 67 are arranged in a row in this order. This allows easy interconnection of the first to seventh contacts 61, 62, 63, 64, 65, 66, 67. A connector of a functional module may engage with the first to fifth contacts 61, 62, 63, 64, 65 or with the fifth to seventh contacts 65, 66, 67 to provide an AC voltage or a DC voltage, respectively, to the functional module.

In FIG. 8, the first to seventh contacts 61, 62, 63, 64, 65, 66, 67 are arranged in an equilateral hexagon, with the fifth contact 65 located at the center of the hexagon. This allows for a compact connector design. However, alternative arrangements of the first to seventh contacts 61, 62, 63, 64, 65, 66, 67 are conceivable, as well.

Figure 9:
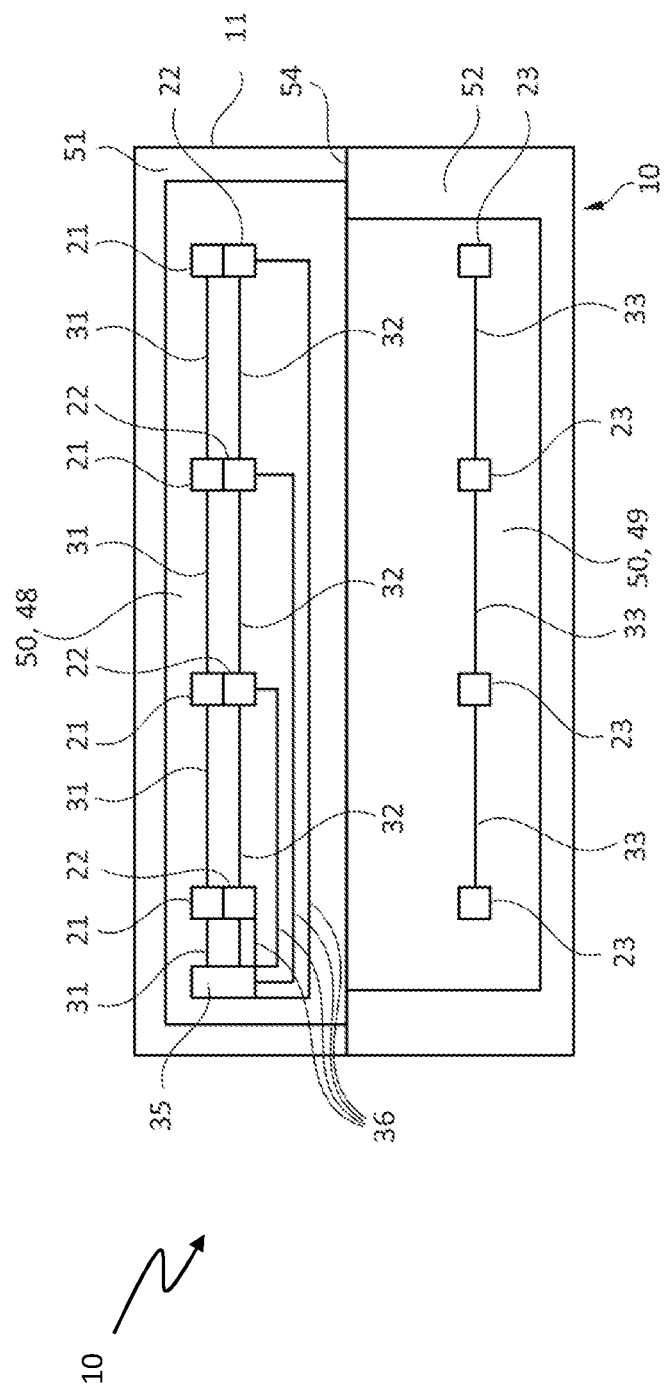
FIG. 9 shows a cross-section through another base module.

FIG. 9 shows a top view of an opened housing 11 of a further base module 10. The base module 10 is constructed identically to the base module 10 of FIGS. 3 and 4, unless differences are described in the following. The data and extra-low voltage circuit board 48 in the first channel 51 includes a safety circuit 35. The safety circuit 35 is connected to the data connections 21 by a data line 31. Furthermore, safety lines 36 are arranged between the safety circuit 35 and the extra-low voltage connections 22, each extra-low voltage connection 22 having its own safety line 36 associated therewith.

The safety circuit 35 is set up to switch off one of the extra-low voltage connections 22. This may e.g. be triggered by a data transmission via data line 31 to the safety circuit 35. A signal for switching off the extra-low voltage connection 22 may be transmitted via the safety line 36. For example, this may be carried out by applying a switching voltage to the safety line 36, which may be used to switch a relay, a transistor or another switch at the extra-low voltage connection 22. Alternatively, a switching signal may also be passed to a functional module by the safety line 36 and a relay, a transistor or another switch may be arranged in a functional module.

The first partition 54 may also be omitted. Furthermore, the data connections 21, extra-low voltage connections 22, low voltage connections 23, the data line 31, the extra-low voltage line 32, the low voltage line 33, the safety lines 36 and the safety circuit 35 may be accommodated on a common circuit board.

Figure 10:
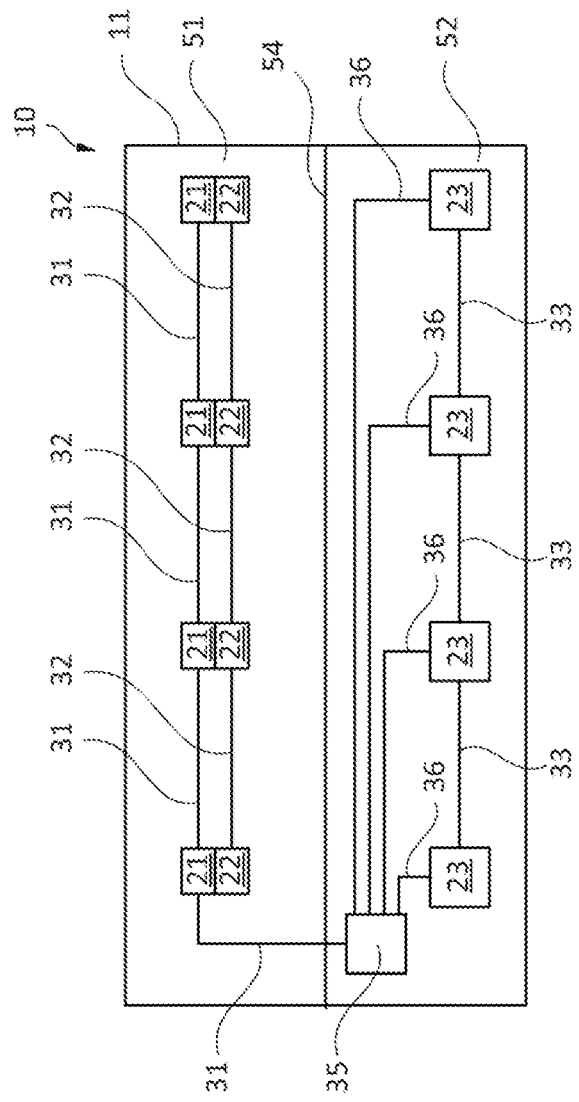
FIG. 10 shows a cross-section through another base module.

FIG. 10 shows a top view of an opened housing 11 of a further base module 10. The base module 10 is constructed identically to the base module 10 of FIG. 9, unless differences are described in the following. The data connections 21, extra-low voltage connections 22, low voltage connections 23, the data line 31, the extra-low voltage line 32, the low voltage line 33, the safety lines 36 and the safety circuit 35 are not accommodated on a printed circuit board. In this case, it may be provided that the connection elements, i.e. the data connections 21, the extra-low voltage connections 22, the low voltage connections 23 and the safety circuit 35 are directly connected to the housing 11. The data line 31, the extra-low voltage line 32, the low voltage line 33 and the safety lines 36 may then be freely routed in the housing 11. Alternatively, however, it would be possible to accommodate data connections 21, extra-low voltage connections 22, low voltage connections 23, the data line 31, the extra-low voltage line 32, the low voltage line 33, safety lines 36 and the safety circuit 35 on one or more circuit boards in analogy to FIG. 9. The safety lines 36 are arranged between the safety circuit 35 and the low-voltage connections 23, each low-voltage connection 23 being assigned its own safety line 36.

The safety circuit 35 is set up to switch off at least one of the low-voltage connections 23. This may e.g. be triggered due to a data transmission via data line 31 to the safety circuit 35. A signal for switching off the low-voltage connection 23 may thereby be transmitted via the safety line 36. For example, this may be done by applying a switching voltage to the safety line 36, which may be used to switch a relay, a transistor or another switch at the low-voltage connection 23.

Figure 11:
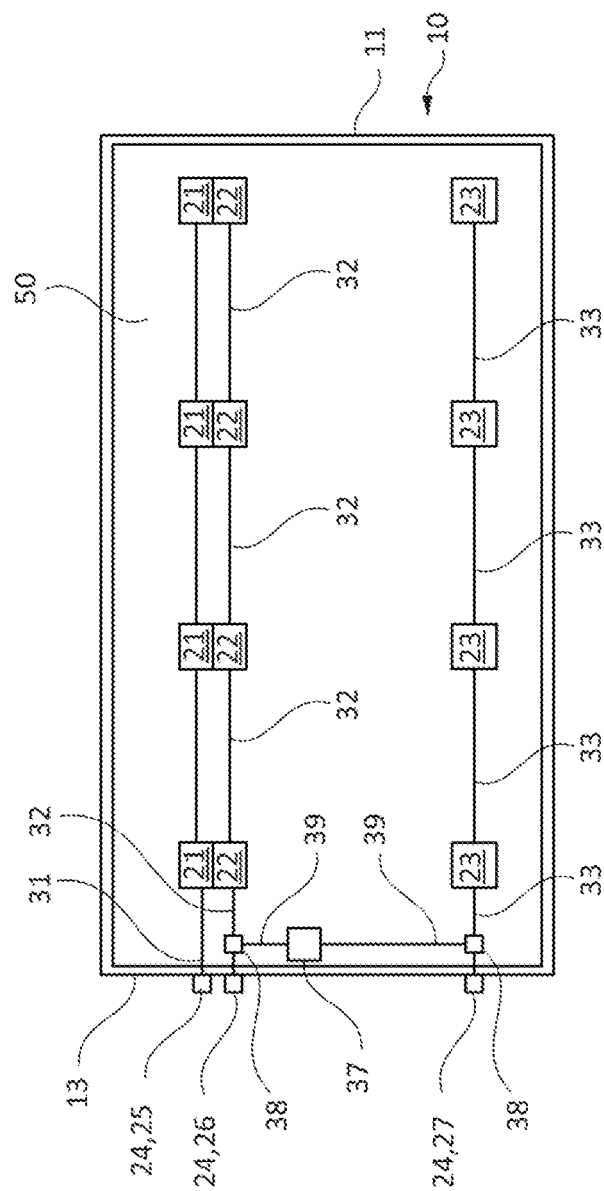
FIG. 11 shows a cross-section through another base module.

FIG. 11 shows a top view of an opened housing 11 of a further base module 10, which corresponds to the base module 10 of FIG. 3, unless differences are described in the following. The base module has a circuit board 50 on which data connections 21, extra-low voltage connections 22, low voltage connections 23, the data line 31, the extra-low voltage line 32 and the low voltage line 33 are arranged. Furthermore, the base module 10 has housing connections 24, the housing connections 24 including a housing data connection 25, a housing-extra low-voltage connection 26, and a housing low-voltage connection 27. The housing data connection 25 is connected to the data connections 21 by a data line 31. The housing extra-low-voltage connection 26 is connected to the extra-low voltage connections 22 by an extra-low voltage line 32. The low-voltage housing connection 27 is connected to the low-voltage connections 23 by a low-voltage line 33.

The housing connections 24 are arranged on a further housing face 13. The housing connections 24 may be used to provide a field bus via the housing data connection 25, an extra-low voltage via the housing extra-low-voltage connection 26 and a low voltage via the housing low-voltage connection 27. Field bus, extra-low voltage and low voltage are available for functional modules via the data connections 21, the extra-low voltage connections 22 and the low voltage connections 23.

It may also be provided to arrange the housing connections 24 on the first housing face 12.

Additionally, the base module 10 of FIG. 11 includes a monitoring circuit 37. The monitoring circuit 37 is arranged to determine an environmental parameter. This may be done by a dedicated sensor associated with the monitoring circuit 37. Alternatively, the monitoring circuit 37 may be connected to the data line 31 and receive a sensor signal via the data line 31. The monitoring circuit 37 is connected to two switches 38 by two monitoring lines 39, one switch 38 being arranged in the extra-low voltage line 32 and one switch 38 being arranged in the low voltage line 33. Via the switches 38, the monitoring circuit 37 may switch off the base module 10 and thus transfer it to a safe operating state. This may e.g. be triggered by the ambient parameter being outside a predetermined range of values. In particular, the ambient parameter may comprise a tilt or a vibration. This may e.g. trigger an automatic shutdown of the base module 10 in the event of an incorrect installation position of the base module 10.

In this regard, the monitoring circuit 37 may be in the form of a plug-in circuit board which may be plugged into an insert provided for this purpose within the base module 10.

Although the base module of FIG. 11 shows both the housing connections 24 and the monitoring circuit 37 with switches 38 and monitoring lines 39, these features are independent of one another and may each be implemented individually in the base modules 10 of the previous embodiments.

As an alternative to the housing connections 24, it may also be provided that data and/or an extra-low voltage and/or a low voltage are introduced into the base module 10 via a functional module. The connection is thus made via the connection elements 20. A switch-off due to the monitoring circuit 37 and/or the safety circuit 35 shown in FIG. 9 then takes place between the connection element provided for the supply and the connection elements of the further slots.

Figure 12:
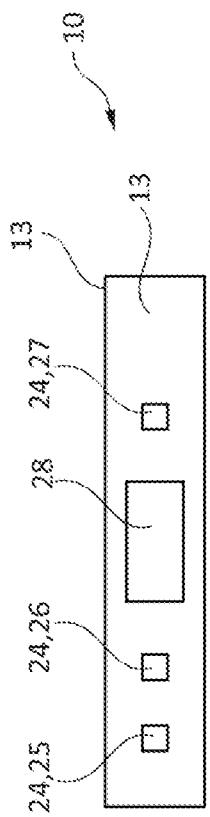
FIG. 12 shows a further housing face of a base module.

FIG. 12 shows a lateral view of the further housing face 13 of the base module of FIG. 11, at which the housing connections 24 are arranged. In addition to the housing connections 24, an optional pressure-equalizing membrane 28 is arranged on the further housing face, by which an internal pressure inside the housing 11 may be equalized with an external pressure outside the housing 11. The pressure-equalizing membrane 28 may also be used in the base modules 10 of the previous embodiments. Furthermore, the pressure-equalizing membrane 28 may be implemented independently of the housing connections 24.

Figure 13:
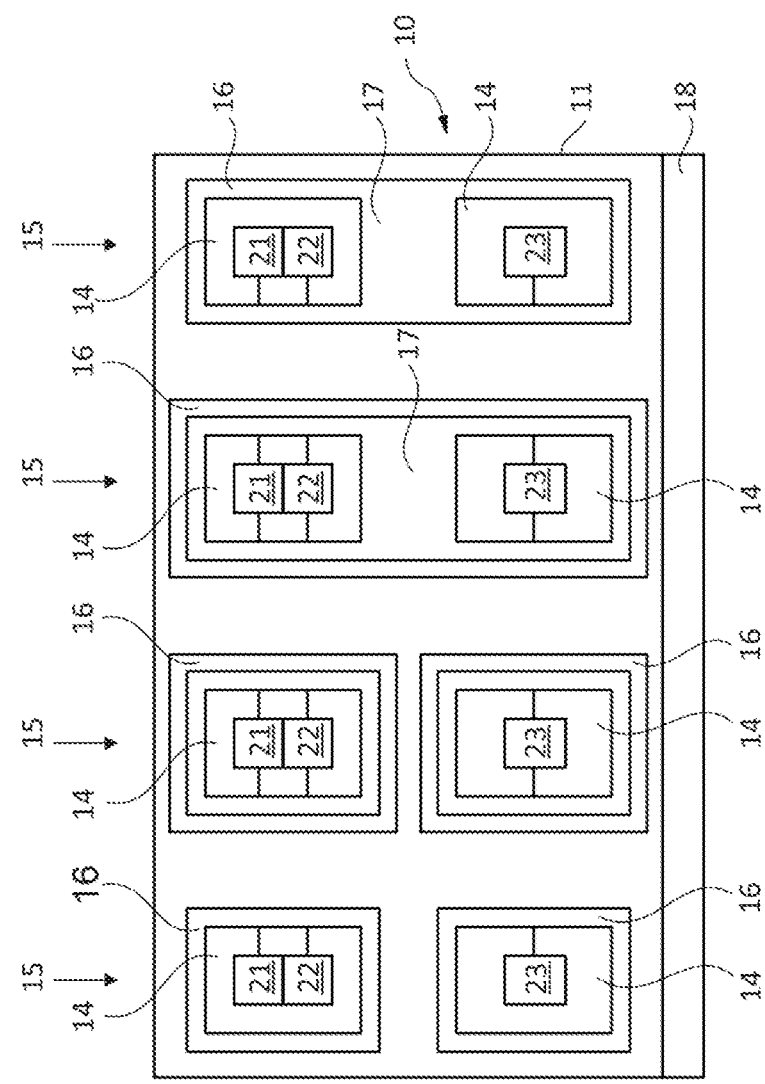
FIG. 13 shows a top view of a further base module.

FIG. 13 shows a top view of a further base module 10, which corresponds to the base module 10 of FIGS. 3 and 4, unless differences are described in the following. At least one seal 16 is provided at each slot 15, the seals 16 each surrounding at least one opening 14. A total of four different possible configurations of the seal 16 are shown in FIG. 13.

A first possibility for embodying of the seal 16 is that two seals 16 are arranged circumferentially around both openings 14 of a slot 15. Each of the openings 14 of a slot thus has its own seal 16. The seals 16 are directly adjacent to the openings 14. This embodiment is shown on the left of the four slots 15.

In a second possibility for embodying the seal 16, two seals 16 are circumferentially arranged around both openings 14 of a slot 15, as well. The seals 16 are arranged at a distance from the openings 14. This embodiment is shown at the second slot 15 from the left.

A third possible embodiment of the seal 16 is that the seal 16 is circumferentially arranged around both openings 14 of a slot 15. The seal 16 is also circumferential with respect to an intermediate space 17 between the openings 14. This embodiment is shown at the second slot 15 from the right. The seal 16 may again be directly adjacent to the openings 14 or spaced apart (as shown here).

A fourth possibility for the embodiment of the seal 16 is a seal 16 running around both openings 14 of a slot 15, which also covers an intermediate space 17 between the openings 14. The seal 16 is thus embodied as a surface seal. This embodiment is shown on the right of the four slots 15. The seal 16 may again be directly adjacent to the openings 14 (as shown here) or spaced apart.

When attaching a functional module to the base module 10, it may be provided that the seal is compressed to a certain extent in order to be able to realize a seal against dust and liquids. It may be provided that, due to this compression, a thickness of the seal is reduced by up to twenty-five percent after a functional module is attached.

In addition, the base module 10 has a grounding rail 18. The grounding rail 18 may be used to ground system parts when the base module 10 is used in a control-cabinet system.

Figure 14:
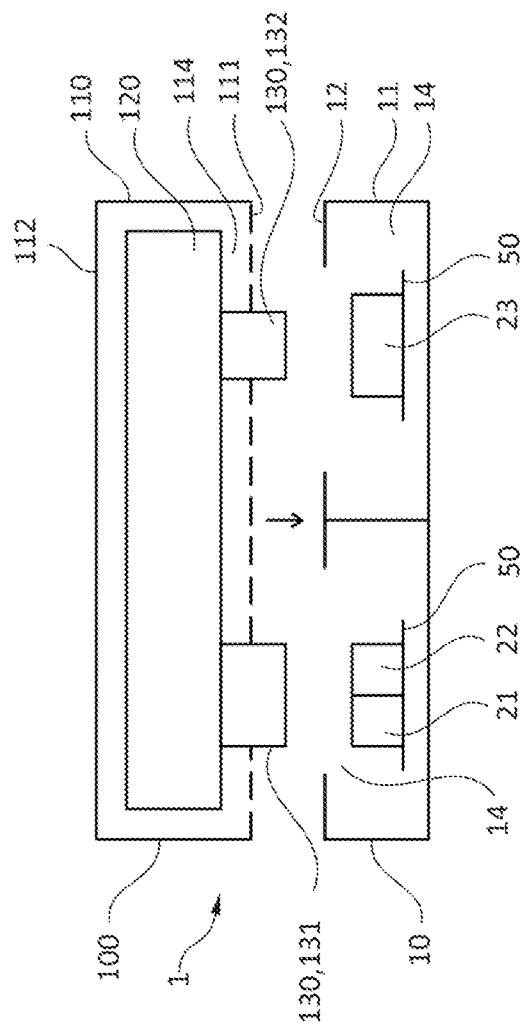
FIG. 14 shows a cross-section through a control-cabinet system consisting of a base module and a functional module.

FIG. 14 shows a cross-section of a control-cabinet system 1 comprising a base module 10 and a functional module 100. The base module 10 corresponds to the base module 10 shown in FIGS. 3 and 4, having two channels 51, 52. The functional module 100 comprises a module housing 110 and an electronic circuit 120 within the module housing 110, wherein the electronic circuit 120 may be arranged on a circuit board. A module housing face 111 of the module housing 110 with the module housing opening 114 faces the base module 10. Further, the module housing 110 has other module housing faces 112. The first housing face 12 with the openings 14 of the base module 10 faces the functional module 100. Furthermore, the functional module 100 has two connection elements 130, which are configured as a first plug-in element 131 and as a second plug-in element 132. In this context, the first plug-in element 131 is thereby arranged to engage with the data connection 21 as well as the extra-low voltage connection 22 of the base module 10. The second plug-in element 132 is arranged to engage in the low-voltage connection 23 of the base module 10. Alternatively, the second plug-in element 132 may be omitted. In that case, only the first plug-in element 131 engages with the data connection 21 as well as the extra-low voltage connection 22 of the base module 10, which prevents the functional module 100 from accessing the low voltage. Furthermore, it may be provided that the first plug-in element 131 engages exclusively with the data connection 21. Then, only the data and, depending on whether the second plug-in element 132 is present, the low voltage are available to the functional module 100. In FIG. 14, base module 10 and functional module 100 are not yet connected to one another, but are spaced apart. An arrow indicates a movement of the functional module 100 towards the base module 10, wherein the functional module 100 is inserted into the base module 10. As shown in FIG. 14, the first housing face 12 and the first module housing face 111 may have a planar configuration.

Figure 15:
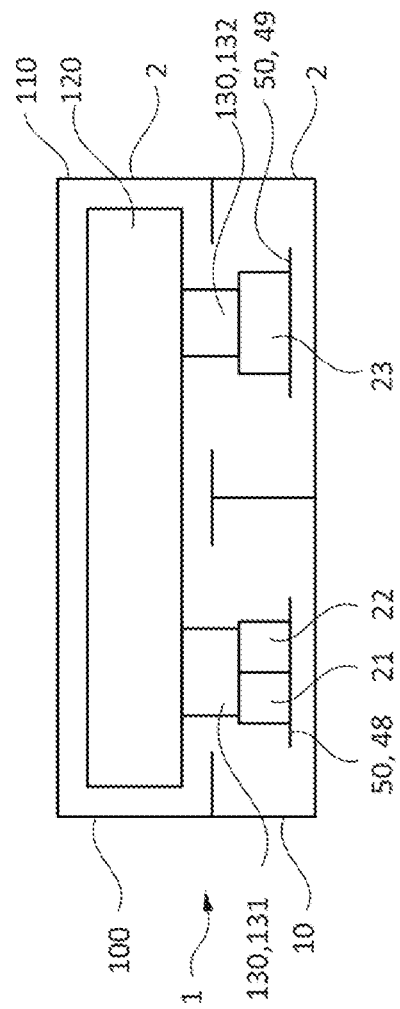
FIG. 15 shows a further cross-section through the control-cabinet system.

FIG. 15 shows a cross-section of the control-cabinet system 1 of FIG. 14 after the functional module 100 has been inserted into the base module 10. After the functional module 100 has been attached to the base module 10, the openings 14 or the module housing opening 114, respectively, are no longer accessible, since the housing 11 and module housing 110 form a joint housing 2.

As an alternative to the control-cabinet system 1 shown in FIGS. 14 and 15, one of the other embodiments of the base module 10 may be used, as well. In particular, an embodiment example without channels 51, 52, or with the third channel 53, or with a common opening 14 for all connection elements 20 may be used.

In its dimensions transversely to the channels 51, 52, the module housing 110 corresponds to the base module 10. The module housing 110 may be of smaller or larger embodiment and, for example, project beyond the base module 10. Further, when not engaging the low voltage connection 23, the module housing 110 may also be configured such that the opening 14 above the low voltage connection 23 is not covered by the module housing 110. In this case, an additional cover or alternatively a functional module 100 which comprises exclusively a module housing 110 and may also be referred to as a blank module may be provided to cover this opening 14.

Figure 16:
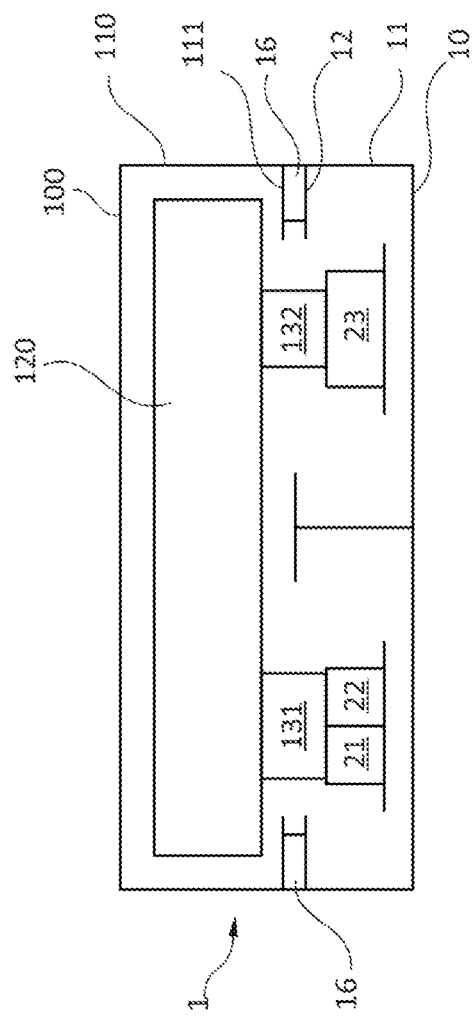
FIG. 16 shows a cross-section through another control-cabinet system consisting of a base module and a functional module.

FIG. 16 shows a cross-section through a further control-cabinet system 1, which corresponds to the control-cabinet system 1 of FIG. 15, unless differences are described in the following. A seal 16 is arranged between the base module 10 and the functional module 100. The seal 16 may correspond to one of the variants shown in FIG. 13 and be arranged on the base module 10. Alternatively, the seal 10 may be inserted before the functional module 100 is inserted. As a third alternative, the seal 16 may be assigned to the functional module 100. With the seal, it may be achieved that the common housing 2 is dust-tight and tight against the penetration of liquids and thus e.g. the protection class IP67 is achieved.

Figure 17:
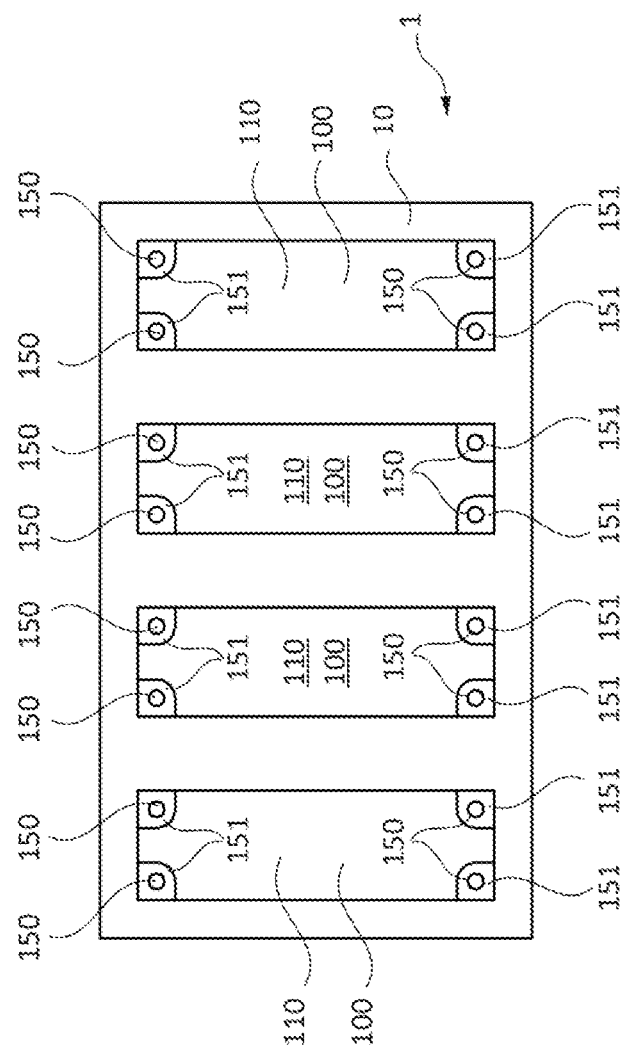
FIG. 17 shows a first fastener.

FIG. 17 shows a top view of a control-cabinet system 1 consisting of a base module 10 and four functional modules 100, each with a module housing 110. The module housings 110 each have four recesses 151 with four through holes 150. A respective screw may be guided through a respective through hole 150 for screwing the functional modules 100 to the base module 10. In the base module 10, the screw may engage in a threaded hole 44 in each case. The threaded holes 44 may be embodied analogously to the threaded holes 44 shown in FIG. 3. A screw head may be arranged within the recess 151.

Figure 18:
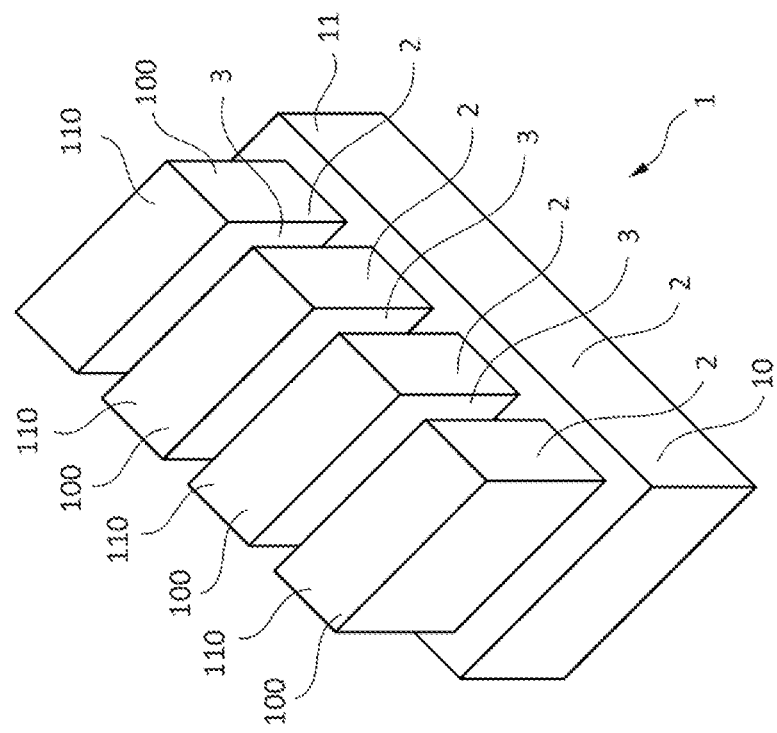
FIG. 18 shows an isometric view of the control-cabinet system.

FIG. 18 shows a highly simplified isometric view of a control-cabinet system 1 comprising a base module 10 and four functional modules 100. An intermediate module space 3 is free between the functional modules 100 and may be used for ventilation of the functional modules 100. The housing 10 and the module housings 110 form a common housing 2, which is dust-tight and liquid-tight.

More or less than four functional modules 100 may also be arranged on the base module 10. In particular, the functional modules 100 may also have a greater width. This means that a functional module 100 may cover several columns of connection elements 20 and the associated openings 14.

In particular, the functional modules 100 may include input modules, output modules, computer modules, network switch modules, servo control modules, line filter modules, PLC control modules, motor control modules, contactor modules, bus coupler modules, frequency converter modules, and/or power supply modules, or a combination of said modules. In this regard, the functional modules 100 may provide the functionalities that are available in known control cabinets.

The housing 11 of the base module 10 or the module housing 110 of the functional module 100 may be embodied as a bar-pressed profile. Alternatively, the housing 11 or the module housing 110 may be manufactured by die casting. Suitable materials include, in particular, aluminum or zinc or an alloy of the aforementioned metals.

Figure 19:
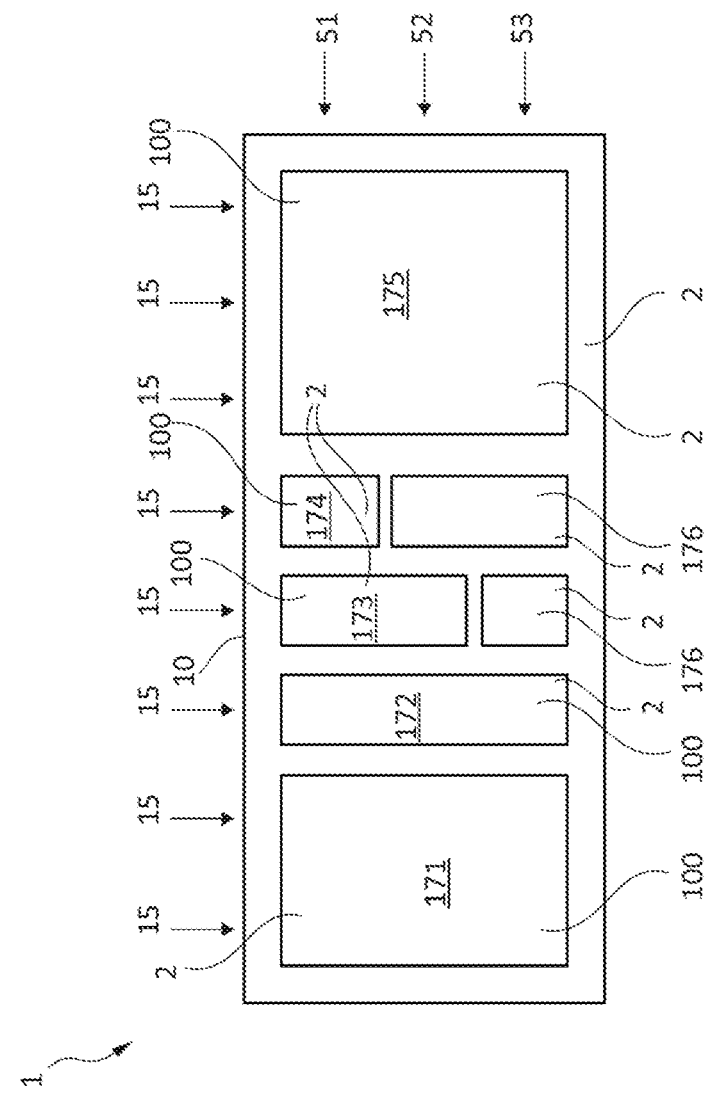
FIG. 19 shows a top view of another control-cabinet system.

FIG. 19 shows a top view of a further control-cabinet system 1 comprising a base module 10 and five functional modules 100 attached to the base module as already described. Here, the base module has three channels 51, 52, 53 as shown in FIGS. 5 and 6, with a total of eight slots 15 arranged on the base module 10. A first functional module 171 extends over all three channels 51, 52, 53 and two slots 15. A second functional module 172 extends over all three channels 51, 52, 53 and one slot 15. A third functional module 173 extends over the first channel 51 and the second channel 52 and one slot 15. A cover 176 closes the third channel 53 at this slot 15. Instead of one or more covers 176, empty housings or other functional modules may be provided. A fourth functional module 174 extends across the first channel 51 and a slot 15, and the second channel 52 and the third channel 53 at this slot 15 are also closed by a cover 176. A fifth functional module 175 extends over all three channels 51, 52, 53 and three slots 15.

The first functional module 171, the second functional module 172 and the fifth functional module 175 may include module connection elements that engage data connections, low voltage connections, and low voltage connections of the base module 10. Furthermore, cooling air from the third duct 53 may be available to the first functional module 171, the second functional module 172 and the fifth functional module 175. The third functional module 173 may also include module connection elements that engage data connections, extra-low voltage connections, and low voltage connections of the base module 10, but cooling air from the third channel 53 is not available to the third functional module 173. The fourth functional module 174 may have module connection elements that engage data connections and low voltage connections of the base module 10, but the cooling air from the third channel 53 and the low voltage is not available to the fourth functional module 174.

The covers 176 are part of the joint housing 2 of the control-cabinet system 1 and serve to protect the openings of the base module 10 against ingress of objects, dust and liquids not covered by the functional modules 171, 172, 173, 174, 175.

Figure 20:
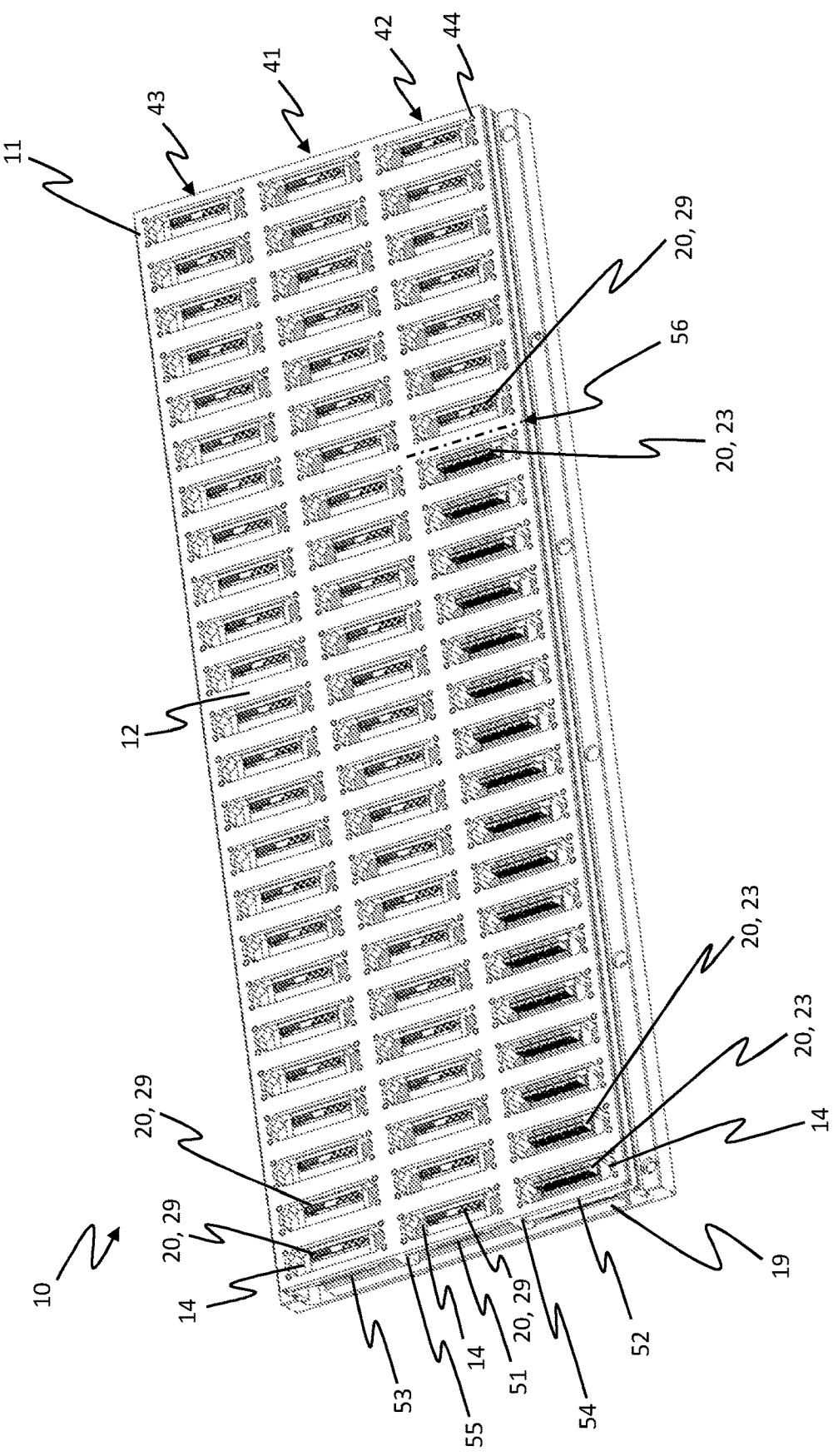
FIG. 20 shows an isometric view of a further base module.

FIG. 20 shows an isometric view of a base module 10 which corresponds to the base module 10 of FIGS. 5 and 6, unless differences are described in the following. In contrast to the base module of FIGS. 5 and 6, in FIG. 20 the first to third rows 41, 42, 43 of openings 14 are arranged in a different order. The first row 41 of openings 14 is arranged centrally, and the second row 42 and the third row 43 of openings 14 are arranged on opposite sides of the first row 41. Thus, the first channel 51, which is associated with the first row 41, is also arranged centrally between the second channel 52 and the third channel 53. Consequently, both the first partition 54 and the second partition 55 are adjacent to the first channel 51.

Connection elements 20 are arranged in all first to third channels 51, 52, 53. Combined connections 29 for data and extra-low voltages are provided in the first channel 51. In other words, the combined connection 29 represents a connection element 20 which combines the functions of the data connection 21 and the extra-low voltage connection 22 of FIGS. 5 and 6.

Low-voltage connections 23 are arranged in the second channel 52. However, in contrast to FIGS. 5 and 6, it is not intended that all openings 14 of the second row 42 are each assigned a low-voltage connection 23. The low-voltage connections 23 are arranged in the second channel 52 only up to a boundary 56. The boundary is illustrated in FIG. 20 and in the following figures by a dash-dot line. In the area of the remaining openings 14 of the second row 42, combined connections 29 are arranged in the second channel 52 analogously to the first channel 51. With such an arrangement, different demands to a control-cabinet system consisting of base module 10 and functional modules 100 may be met and at the same time better utilization of the slots for functional modules provided by the base module 10 may be realized.

Joint connections 29 are also arranged in the third channel 53, analogously to the first channel 51 and to a part of the second channel 52. In addition, it may be provided that cooling air is guided through the third channel 53. Alternatively or additionally, the first channel 51 and/or the second channel 52 may also be used to guide cooling air.

Cooling elements 19 are arranged below the first to third channels 51, 52, 53. These are embodied as cooling fins, but may also have a different shape. The cooling elements 19 may be embodied to transport heat from the interior of the housing 11 to the surroundings. Blind holes 44 with internal threads are arranged around the openings 14, which may be used to attach functional modules to the base module 10. As shown in FIG. 20, the first housing face 12 may be flat.

Data lines may interconnect all combined connections 29 in such a way that a field bus may be tapped through all combined connections 29.

The combined connections 29 may be arranged below the openings 14. The low-voltage connections 23 may also be arranged below the openings 14. Alternatively, the low-voltage connections may be routed through the openings 14 and thus also be arranged partially above the first side 12.

Figure 21:
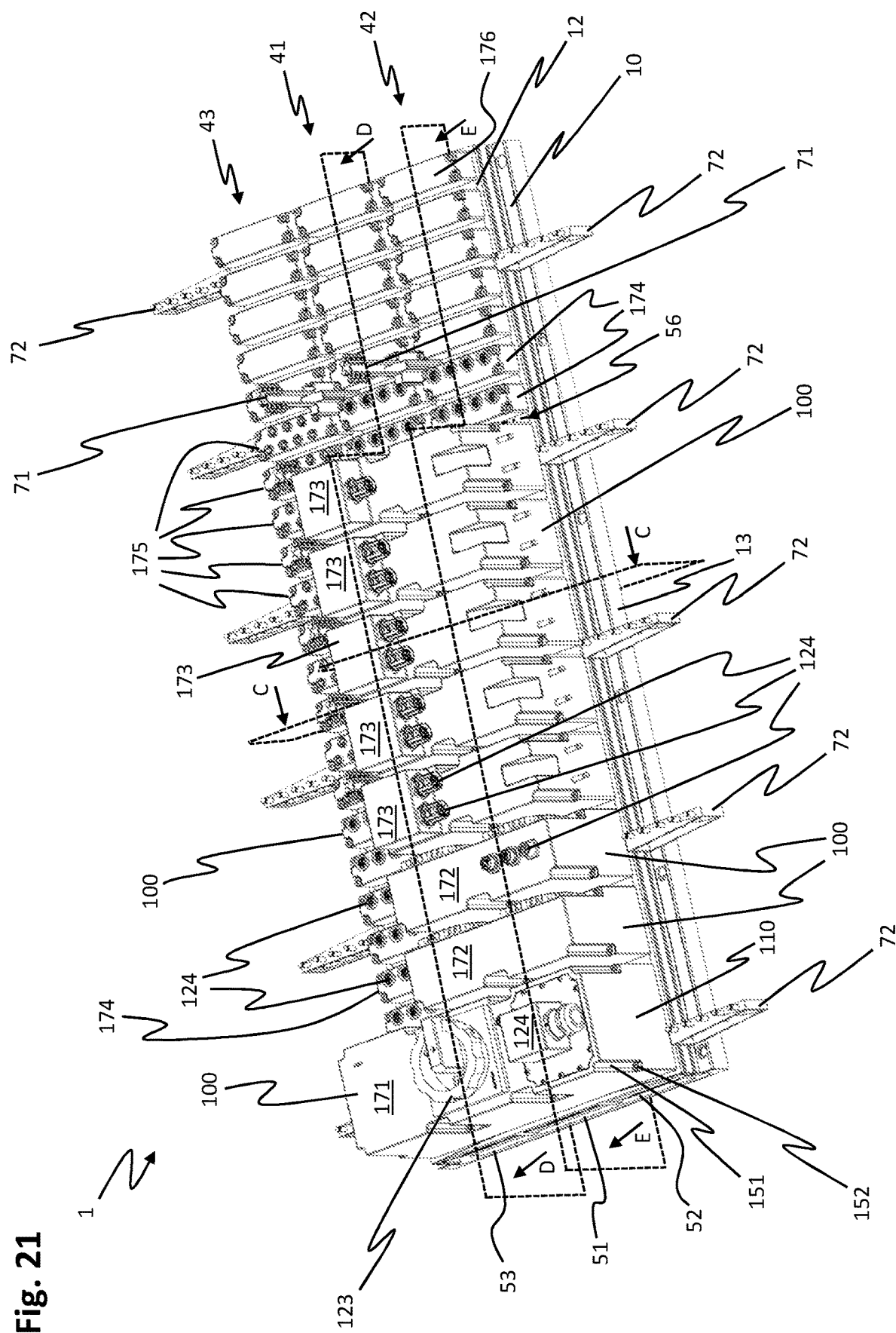
FIG. 21 shows an isometric view of a further control-cabinet system.

FIG. 21 shows a control-cabinet system 1 consisting of the base module 10 of FIG. 20 and several functional modules 100. The functional modules 100 are of different sizes and cover a different number of openings, as in FIG. 19. Furthermore, also analogous to FIG. 19, covers 176 are arranged above openings without functional modules 100. The functional modules 100 may be connected to the base module 10 as shown in FIGS. 14 to 18.

Up to the boundary 56 in the areas where low-voltage connections are arranged in the second channel 52, the functional modules cover both the first channel 51 and the second channel 52. A first functional module 171 in this area also covers the third channel 53, while second functional modules 172 and third functional modules 173 only cover the first channel 51 and the second channel 52. Fourth functional modules 174 and fifth functional modules 175 each cover only one of the first to third channels 51, 52, 53, with the third channel 53 being covered only by fourth functional modules 174 and fifth functional modules 175 in addition to the first functional module 171. The first channel 51 and the second channel 52 are covered by the fourth functional modules 174 from the boundary 56 onwards, i.e. in areas where combined connections are arranged in the second channel 52. As a result, at least one combined connection 29 is available for each functional module 100, wherein all functional modules 100 may be connected to the field bus.

The first functional module 171 has both a closed-loop control element 123 and a peripheral connection element 124. The further second to fifth functional modules 172, 173, 174, 175 have no control elements 123 and only partial peripheral connection elements 124. With screws 152, which are arranged in recesses 151 of the module housing 110, the functional modules 100 are fastened to the base module 10. Thereby, the screws 152 engage in the threaded holes 44 shown in FIG. 20, analogously to the description in connection with FIGS. 3 and 17.

First cable guiding elements 71 are arranged on the first housing face 12 of the base module 10, which serve to guide cables connected to the peripheral connection elements 124 in an orderly manner. Second cable guiding elements 72 are arranged on further housing faces 13, which also serve for the orderly guiding of cables connected to the peripheral connection elements 124.

Since all openings of the base module 10 are closed by the functional modules 100 or the cover 176, the control-cabinet system 1 is embodied to be liquid-tight and dust-tight.

Figure 22:
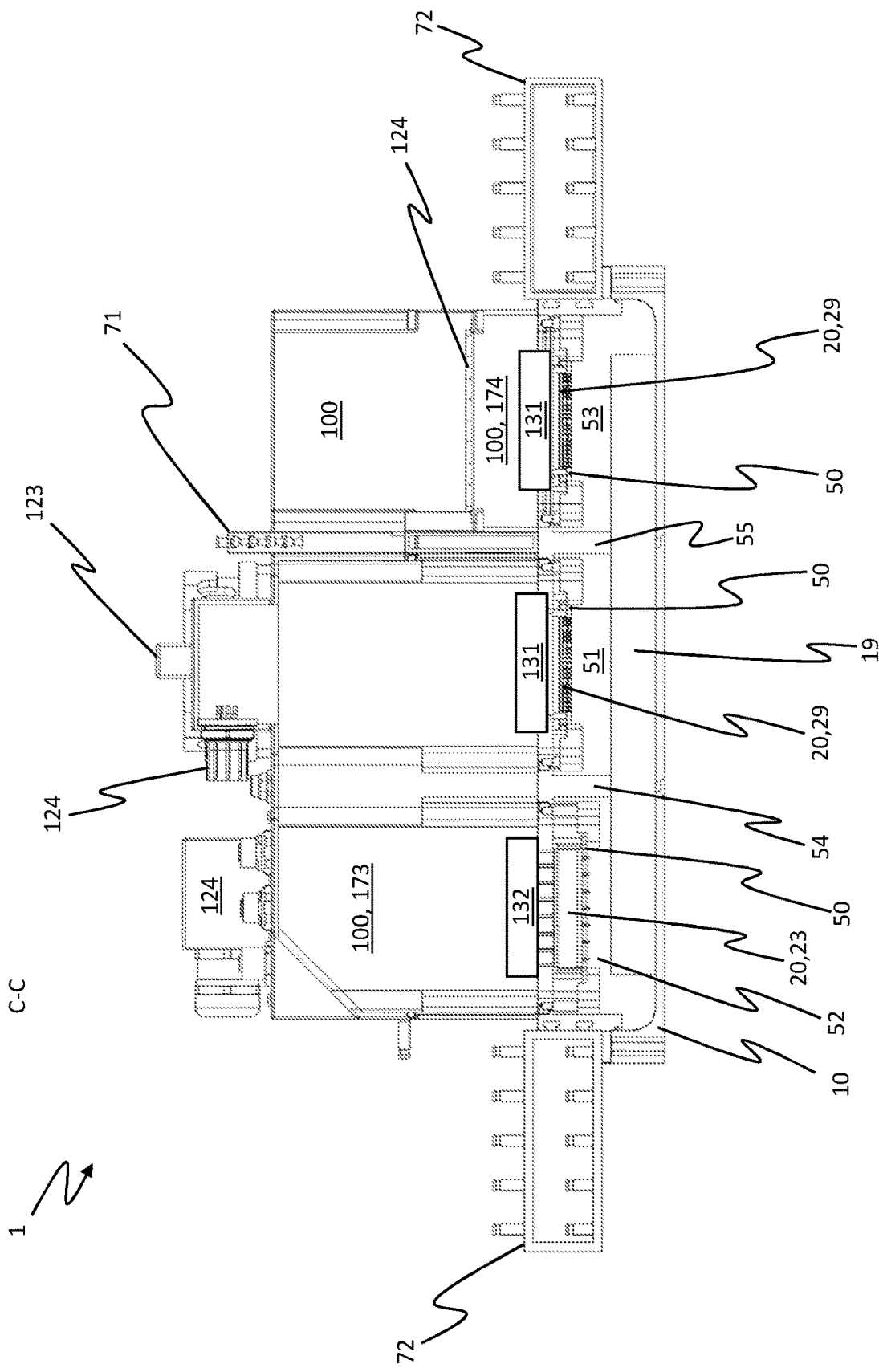
FIG. 22 shows a cross-section through the further control-cabinet system.

FIG. 22 shows a cross-section through the control-cabinet system 1 of FIG. 21 in the area of one of the third functional modules 173 at the sectional plane marked with a C. The cooling elements 19 are guided over all three first to third channels 51, 52, 53, with partitions 54, 55 extending to the cooling elements 19. The sectioned third functional module 173 includes a first plug-in element 131 that engages with the combined connection 29 of the first channel 51. A second plug-in element 132 of the third functional module 173 engages the low voltage connection 23. A first plug-in element 131 of the fourth functional module 174 engages the combined connection 29 of the third channel 53.

The further functional modules 100 shown in FIG. 21 may be connected to the connection elements 20 by plug-in elements 131, 132 in the same way as the functional modules 173, 174 shown in FIG. 22.

Figure 23:
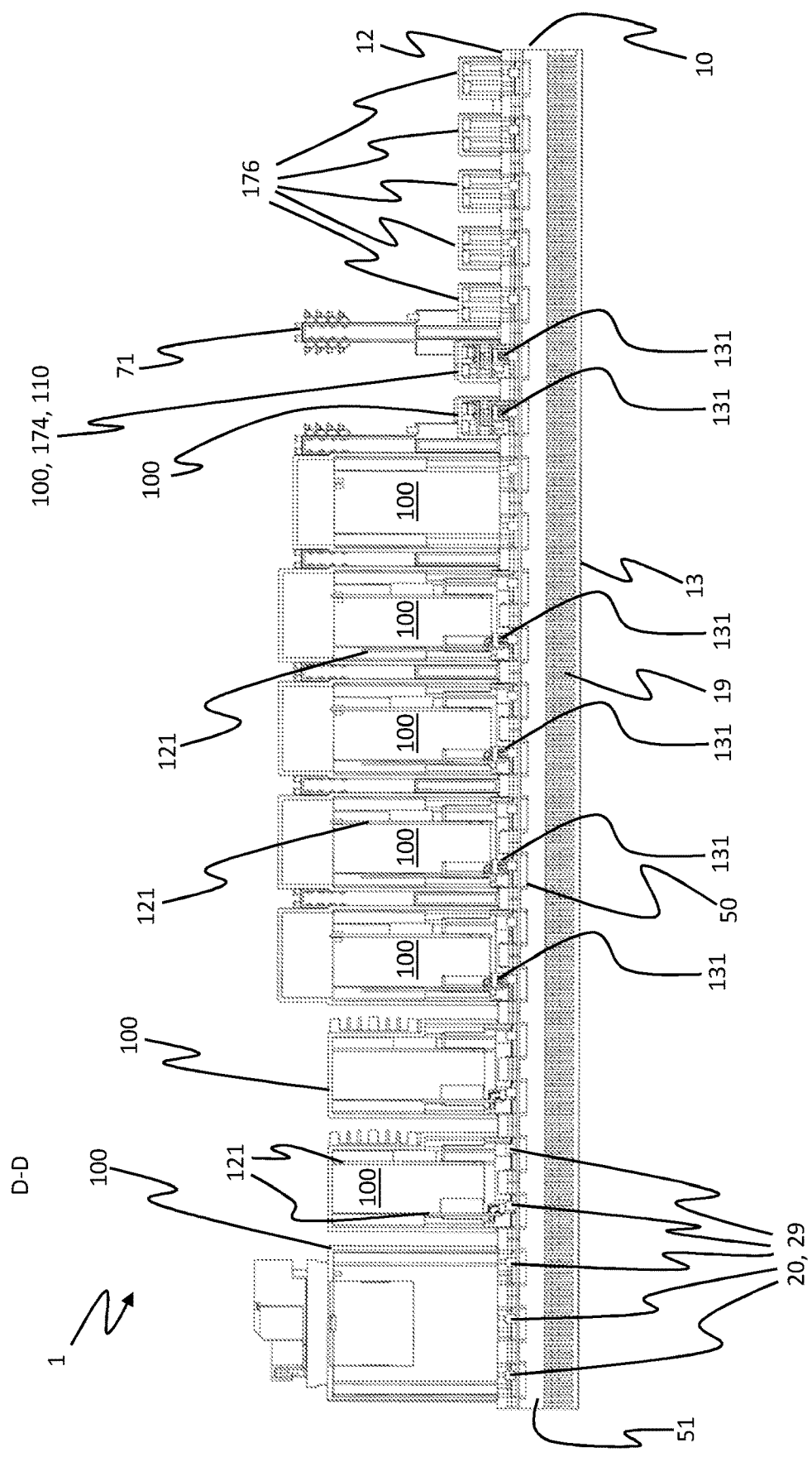
FIG. 23 shows a further cross-section through the further control-cabinet system.

FIG. 23 shows a cross-section through the control-cabinet system 1 of FIG. 21 along the first channel 51 at the sectional plane marked with a D. First plug-in elements 131 engage with the combined connections 29. The covers 176 are substantially the same as the module housings 110 of the fourth functional modules 174, but without electronic circuit and peripheral connection elements. The cooling elements 19 are guided entirely over a further housing face 13, which is opposite to the first housing face 12. Alternatively, it may be provided that the cooling elements 19 are provided only in a partial area of the base module 10.

Figure 24:
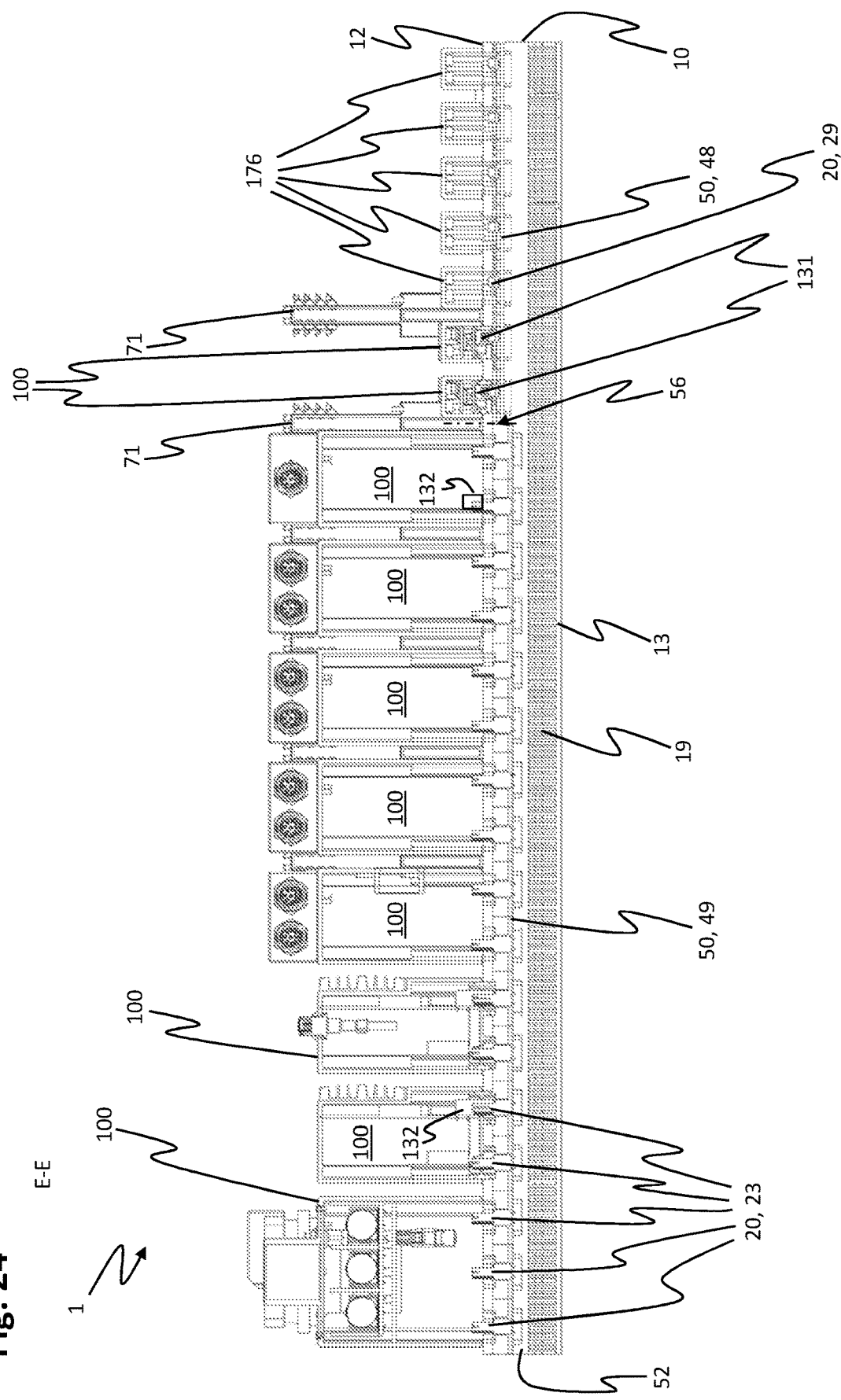
FIG. 24 shows a further cross-section through the further control-cabinet system.

FIG. 24 shows a cross-sectional view of the control-cabinet system 1 of FIG. 21 along the second channel 52 at the sectional plane marked E. On one side of the boundary 56, on the left in the depiction of FIG. 24, second plug-in elements 132 engage with the low voltage connections 23, but not for each of the functional modules 100 in this area. In particular, those of the functional modules that do not require low voltage do not engage with the low voltage connections 23. On the other side of the boundary 56, on the right of the depiction of FIG. 24, first plug-in elements 131 engage with the combined connections 29. In this case, the low-voltage connections 23 are arranged on a low-voltage circuit board 49, e.g. corresponding to the low-voltage circuit board 49 according to the description for FIGS. 4 and 9. The combined connections 29 are arranged on a data and extra-low voltage circuit board 48, the data and extra-low voltage circuit board 48 being arranged at a different height in the second channel 52 than the low-voltage circuit board 49, the data and extra-low voltage circuit board 48 e.g. corresponding to the data and extra-low voltage circuit board 48 as described in connection with FIGS. 4 and 9.

Figure 25:
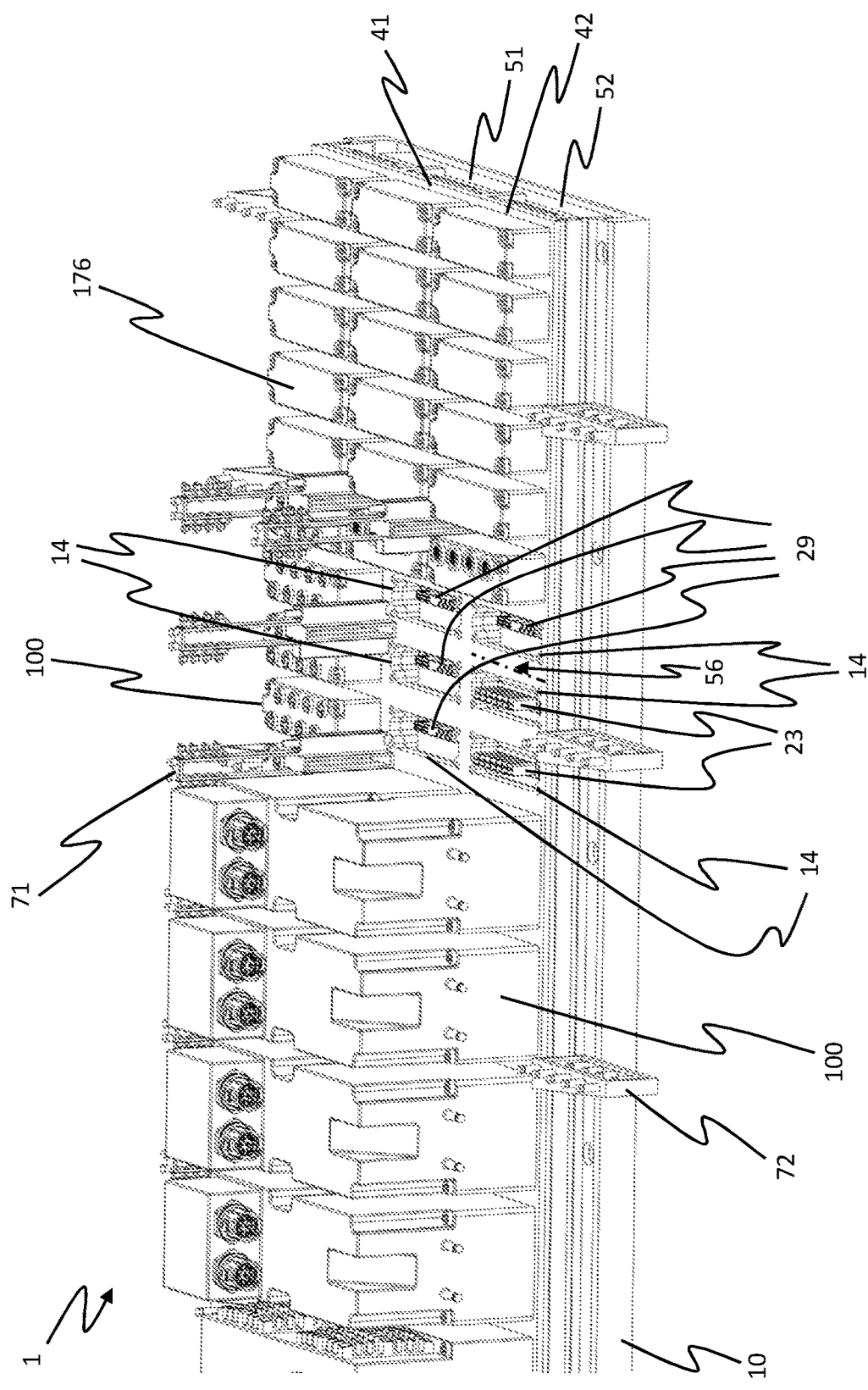
FIG. 25 shows an isometric view of the further control-cabinet system.

FIG. 25 shows an isometric view of a section of the control-cabinet system 1 of FIGS. 21 to 24, in which functional modules have been removed from the base module 10 in the region of the boundary 56. This exposes six openings 14 of the base module 10, three openings 14 each being associated with the first row 41 and thus with the first channel 51, and three openings 14 each being associated with the second row 42 and thus with the second channel 52. In the area of two openings 14 associated with the second channel 52 and arranged to the left of the boundary 56, low-voltage connections 23 are thereby accessible. In the area of the other openings 14, three of which are assigned to the first channel 51 and one of which is assigned to the second channel 52 and which is arranged to the right of the boundary 56, combined connections 29 are accessible in each case. The removal of individual functional modules shown in FIG. 25 may e.g. also be carried out during operation of the control-cabinet system 1. This allows for maintenance and/or replacement of the functional modules 100.

Figure 26:
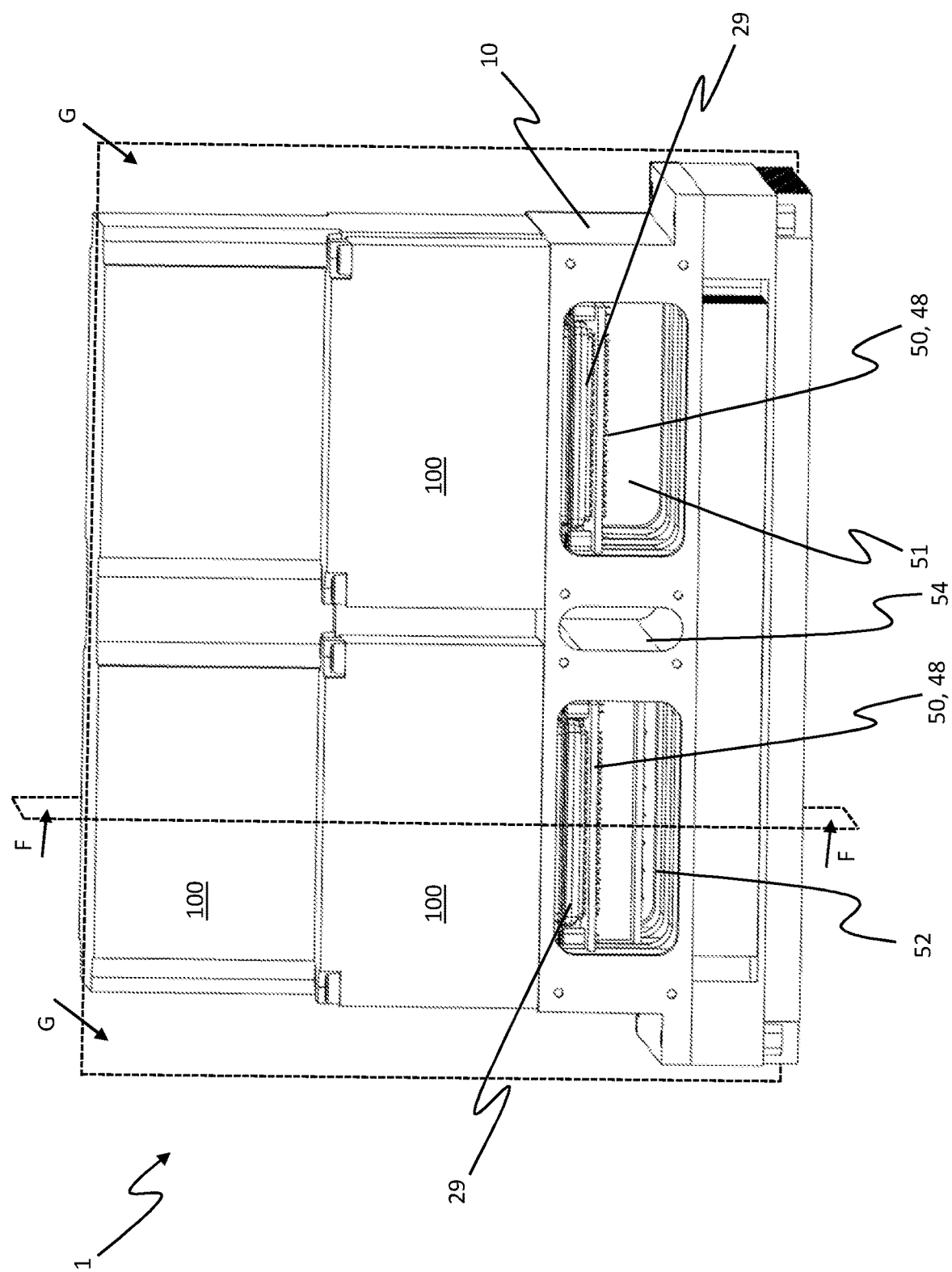
FIG. 26 shows a cross-section through another control-cabinet system.

FIG. 26 shows a cross-section of a further control-cabinet system 1, consisting of a base module 10 and three functional modules 100. The base module 10 corresponds to the base module 10 of FIG. 3 or FIG. 20, unless differences are described in the following. Like the base module 10 of FIG. 3, the base module 10 does not have a third channel. In this case, a sectional plane of the cross-section is arranged outside of the functional modules 100, so that only the base module 10 is open in cross-section. The base module has two channels, i.e., a first channel 51 and a second channel 52, as described for example for FIGS. 3 and 4. In both the first channel 51 and the second channel 52, the base module 10 has a data and extra-low voltage circuit board 48 and a respective combined connection 29 arranged on the data and extra-low voltage circuit board 48. The functional modules 100 located immediately after the sectional plane engage the combined connections 29 and cover the first channel 51 or the second channel 52, respectively. Elsewhere, a low voltage circuit board may be provided in the second channel 52, which may be configured as described in FIGS. 4, 6, 8 and 20. Behind the functional modules 100 arranged directly after the sectional plane, a functional module 100 is arranged covering the first channel 51 and the second channel 52.

Figure 27:
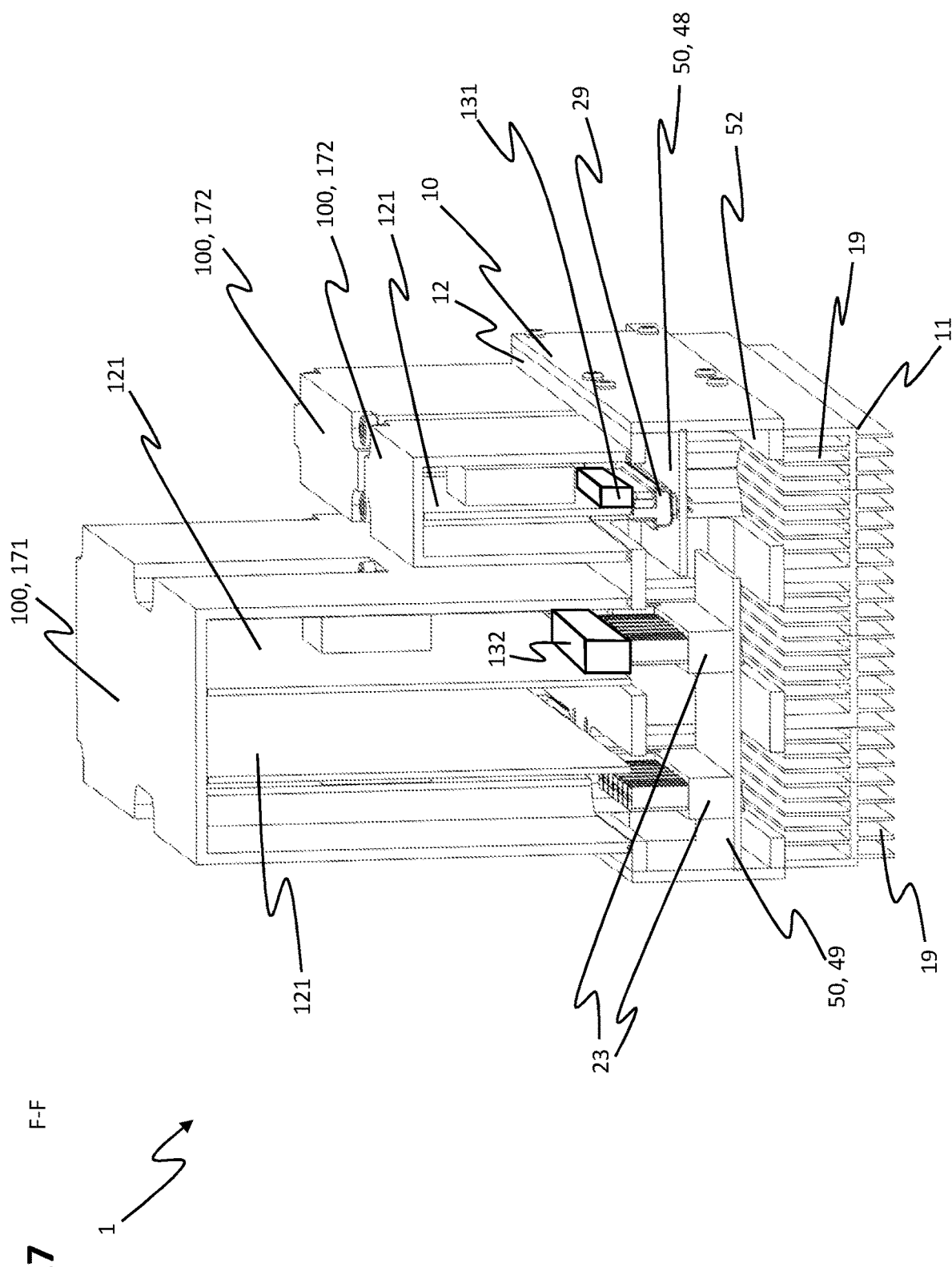
FIG. 27 shows a further cross-section through the further control-cabinet system.

FIG. 27 shows a cross-sectional view of the control-cabinet system 1 of FIG. 26 at the sectional plane marked F. Module circuit boards 121 of a first functional module 171 have electronic circuitry that requires low voltage. Consequently, in the region of the first functional module 171, a module connection element, which is configured in the form of a second plug-in element 132, engages in one of the low-voltage connections 23. The electronic circuitry installed in a second functional module 172 on a module circuit board 121 does not require a low voltage. Furthermore, the second functional module 172 is arranged only above the second channel 52. The second functional module 172 includes a first plug-in element 131 that engages with a combined connection 29 of the data and extra-low voltage circuit board 48.

Shown in FIG. 27, as well, are cooling elements 19, which are arranged at the housing 11 of the base module 10 in the form of cooling fins and allow for heat exchange with the environment.

The module circuit boards 121 are arranged perpendicular to the first housing face 12. However, other arrangements of the module circuit boards 121 are conceivable, as well. The data and extra-low voltage printed circuit board 48 and the low-voltage printed circuit board 49 are each arranged in parallel to the first housing face 12.

Figure 28:
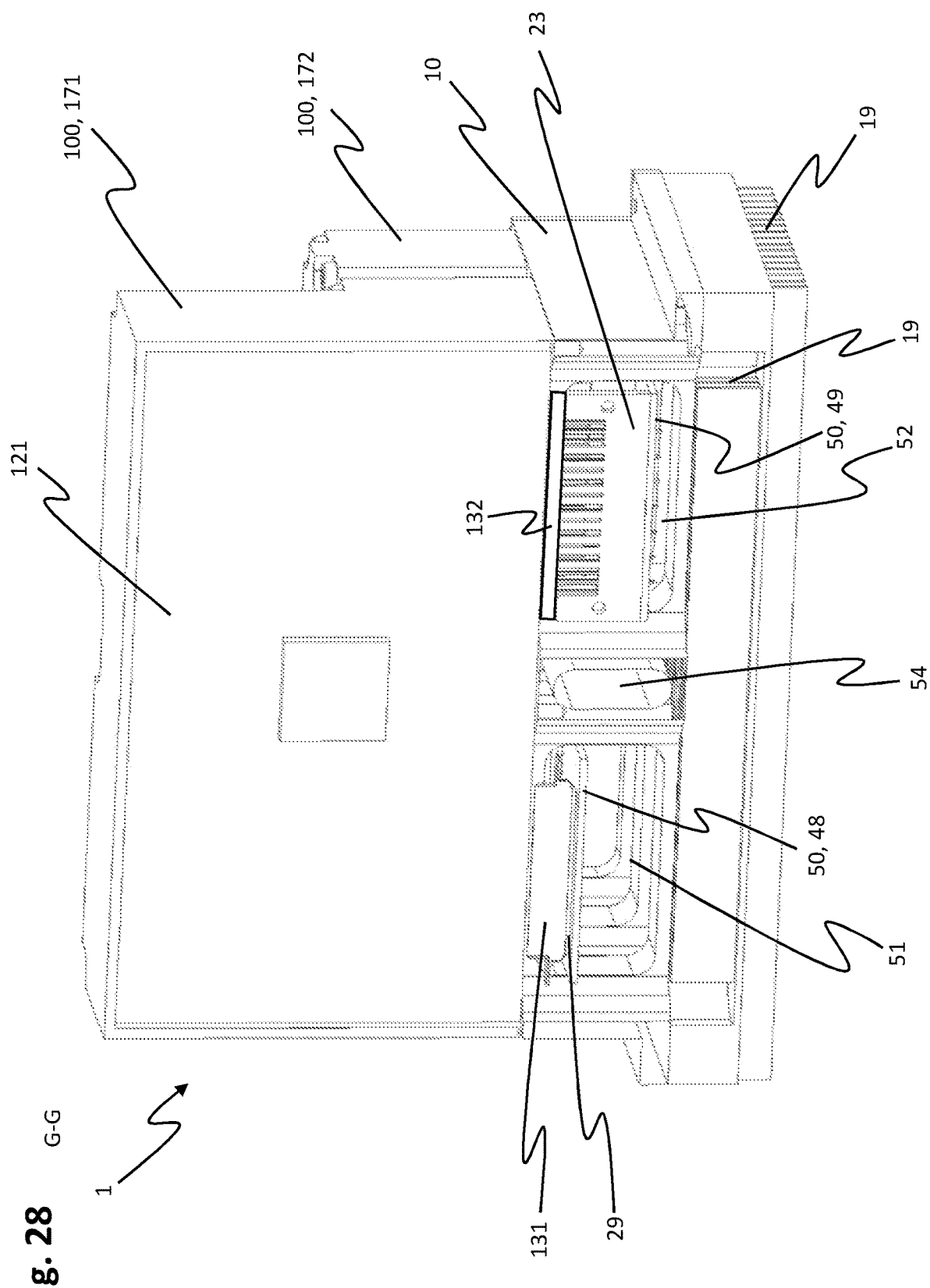
FIG. 28 shows a further cross-section through the further control-cabinet system.

FIG. 28 shows a cross-section through the control-cabinet system 1 of FIGS. 26 and 27, with the sectional plane through the first functional module 171 placed at the section plane marked G in FIG. 26. A first plug-in element 131 engages the combined connection 29. The second plug-in element 132 shown in FIG. 27 is used to engage the low-voltage connection 23.

Thus, FIGS. 26 to 28 show a control-cabinet system 1 which, up to a boundary, comprises low-voltage connections 23 on a low-voltage circuit board 49 in the second channel 52 in analogy to the depiction in FIGS. 20 to 25 as well as combined connections 29 on a data and extra-low-voltage circuit board 48 starting from the boundary.

Figure 29:
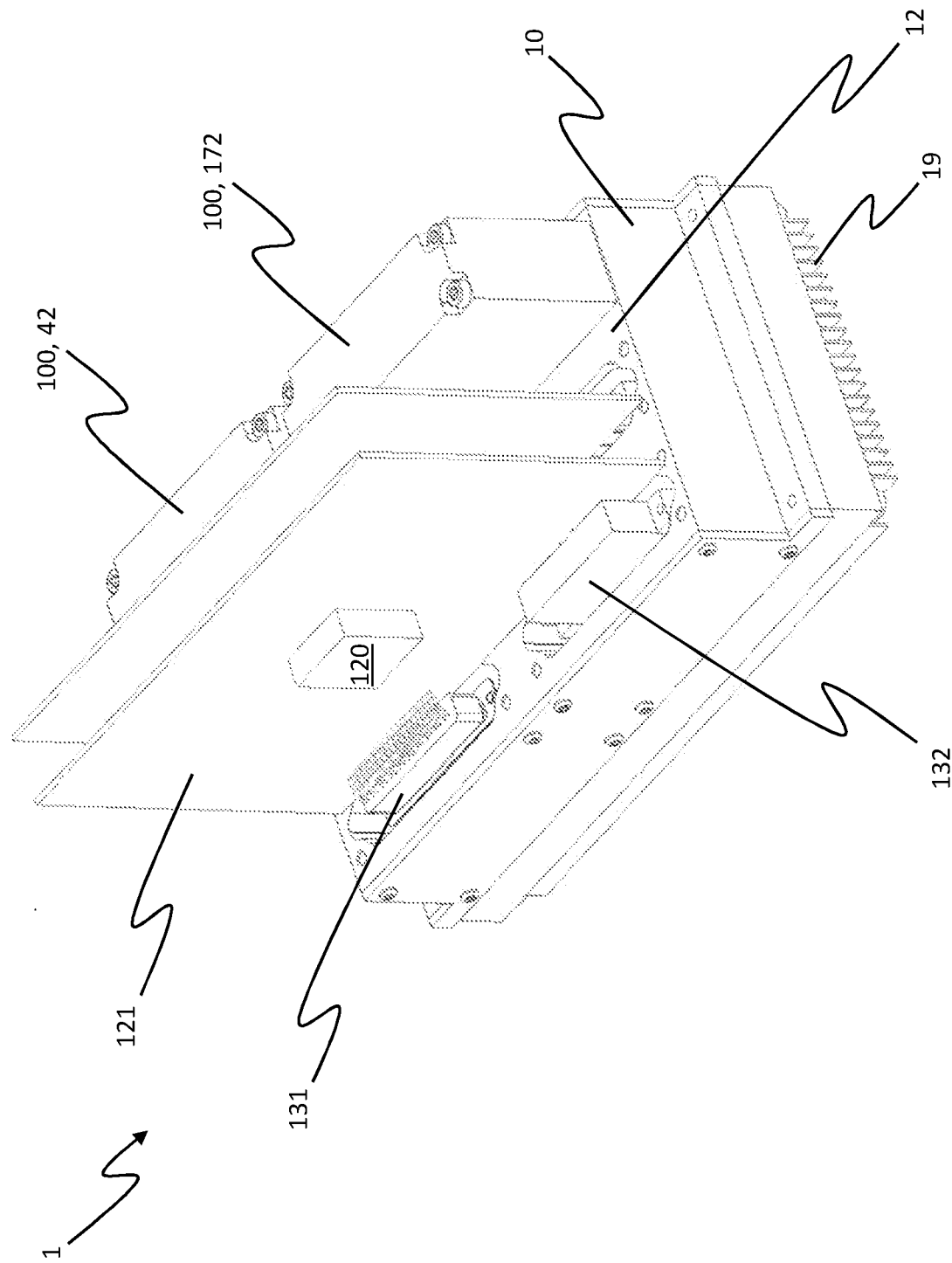
FIG. 29 shows a view of the further control-cabinet system.

FIG. 29 shows a rotated isometric view of the control-cabinet system 1 of FIGS. 26 to 28, wherein the module housing of the first functional module has been removed. The electronic circuit 120 on the module circuit board 121 has a first plug-in element 131 for engaging the combined connection and a second plug-in element 132 for engaging the low voltage connection. The combined connection and the low-voltage connection are thereby covered by the first plug-in element 131 and the second plug-in element 132, respectively. The module circuit board 121 is arranged perpendicular to the first housing face 12. However, other arrangements of the module circuit boards 121 are possible, as well. The first functional module has two module circuit boards 121, but another number of module circuit boards 121 is conceivable, as well.

It may be provided that the base modules shown in FIGS. 20 to 29 have seals analogous to the seals shown in FIGS. 13 and 16. It may further be provided that the base modules have a safety circuit analogous to FIG. 9 or a monitoring circuit analogous to FIG. 10.

TABLE 1

| List of reference numerals: 1-72 | |
|---|---|
| 1 | control-cabinet system |
| 2 | joint housing |

TABLE 1-continued

List of reference numerals: 1-72

| | |
|---|---|
| 3 | intermediate module space |
| 10 | base module |
| 11 | housing |
| 12 | first housing face |
| 13 | further housing face |
| 14 | opening |
| 15 | slot |
| 16 | seal |
| 17 | intermediate space |
| 18 | grounding rail |
| 19 | cooling element |
| 20 | connection element |
| 21 | data connection |
| 22 | extra-low voltage connection |
| 23 | low voltage connection |
| 24 | housing connection |
| 25 | housing data connection |
| 26 | housing extra-low voltage connection |
| 27 | housing low voltage connection |
| 28 | pressure-equalizing membrane |
| 29 | joint connection |
| 31 | data line |
| 32 | extra-low voltage line |
| 33 | low voltage line |
| 35 | safety circuit |
| 36 | safety line |
| 37 | monitoring circuit |
| 38 | switch |
| 39 | monitoring signal line |
| 41 | first row |
| 42 | second row |
| 43 | third row |
| 44 | threaded hole |
| 48 | data and extra-low voltage circuit board |
| 49 | low voltage circuit board |
| 50 | circuit board |
| 51 | first channel |
| 52 | second channel |
| 53 | third channel |
| 54 | first partition |
| 55 | second partition |
| 56 | boundary |
| 60 | connector |
| 61 | first contact |
| 62 | second contact |
| 63 | third contact |
| 64 | fourth contact |
| 65 | fifth contact |
| 66 | sixth contact |
| 67 | seventh contact |
| 71 | first cable guiding element |
| 72 | second cable guiding element |

TABLE 2

List of reference numerals: 100-176

| | |
|---|---|
| 100 | functional module |
| 110 | module housing |
| 111 | module housing face |
| 112 | further module housing face |
| 114 | opening |
| 120 | electronic circuit |
| 121 | module circuit board |
| 123 | (closed-loop) control element |
| 124 | peripheral connection element |
| 130 | module connection element |
| 131 | first plug-in element |
| 132 | second plug-in element |
| 150 | through hole |
| 151 | recesses |
| 152 | screw |
| 171 | first functional module |
| 172 | second functional module |
| 173 | third functional module |

TABLE 2-continued

List of reference numerals: 100-176

| | |
|---|---|
| 174 | fourth functional module |
| 175 | fifth functional module |
| 176 | cover |

The invention claimed is:

1. A base module for a control-cabinet system, the base module comprising:
a housing with a first housing face and further housing faces, the first housing face having a grid of openings,
the housing having connection elements for functional modules, the connection elements each being arranged in the region of the openings of the first housing face, and the connection elements comprising data connections, extra-low voltage connections and low-voltage connections;
wherein the data connections are interconnected by a data line of the base module,
wherein a field-bus connection is provided for the data line, wherein the data line is arranged within the housing,
wherein an extra-low voltage line and a low voltage line are arranged within the housing, and
wherein the extra-low voltage line is connected to the extra-low voltage connections and the low voltage line is connected to the low voltage connections.

2. The base module of claim 1, wherein a plurality of data connections and a plurality of extra-low voltage connections are respectively arranged on a data and extra-low voltage conductor board, and wherein a plurality of low voltage connections are disposed on a low voltage conductor board,
wherein the data line and the extra-low voltage line are provided by the data and extra-low voltage conductor board, and
wherein the low voltage line is provided by the low voltage conductor board.

3. The base module according to claim 1, wherein the housing comprises two channels,
wherein the data connections and the extra-low voltage connections are arranged in a first channel and the low voltage connections and/or data connections and the extra-low voltage connections are arranged in a second channel, and
wherein a first partition is arranged between the first channel and the second channel.

4. The base module according to claim 3, wherein a plurality of data connections and a plurality of extra-low voltage connections are respectively arranged on a data and extra-low voltage circuit board, and wherein a plurality of low voltage connections are disposed on a low voltage circuit board,
wherein the data line and the extra-low voltage line are provided by the data and extra-low voltage circuit board,
wherein the low voltage line is provided by the low voltage circuit board,
wherein the data and extra-low voltage circuit board is arranged in the first channel, and
wherein the low voltage circuit board is arranged in the second channel.

5. The base module according to claim 4, wherein a data and extra-low voltage circuit board are arranged in the second channel.

6. The base module according to claim 3, wherein the housing comprises a third channel,
wherein a second partition is arranged between the third channel and the first channel or the second channel, and
wherein cooling air is guided via the third channel or the low voltage connections and/or data connections and the extra-low voltage connections.

7. The base module according to claim 1, wherein the first housing face is flat.

8. The base module of claim 1, wherein the low-voltage connections each comprise a seven-pin connector, the seven-pin connectors each comprising a first contact, a second contact, and a third contact each for an AC phase, a fourth contact for an AC neutral conductor, a fifth contact for a protective conductor, and a sixth contact and a seventh contact for a DC voltage.

9. The base module according to claim 1, wherein the data connections and extra-low voltage connections are arranged below the openings of the first housing face within the housing.

10. The base module according to claim 1, comprising an additional safety circuit, wherein the safety circuit is configured to disconnect one of the extra-low voltage connections and/or one of the low voltage connections.

11. The base module according to claim 1, further comprising a monitoring circuit, wherein the monitoring circuit is configured to determine an ambient parameter including a tilt and/or a vibration, and is further configured to disconnect one of the extra-low voltage connections and/or one of the low voltage connections if the ambient parameter is outside of a predetermined range of values.

12. The base module according to claim 1, further comprising housing connections for data and/or an extra-low voltage and/or a low voltage at the first housing face and/or at one of the further housing faces.

13. The base module according to claim 1, further comprising a pressure-equalizing membrane.

14. The base module according to claim 1, further comprising a seal, wherein the seal is circumferentially arranged around an opening or circumferentially arranged around a plurality of openings.

15. A control-cabinet system comprising a base module according to claim 1 and at least one functional module,
wherein the functional module is arranged on the first housing face,
wherein the functional module comprises a module housing and at least one module connection element,
wherein the module connection element engages with a connection element for functional modules of the base module, including the data connections and/or the extra-low voltage connections, and
wherein the functional module covers at least one of the openings of the housing.

16. The control-cabinet system according to claim 15, wherein at least one module connection element of the functional module engages with the low voltage connections.

17. The control-cabinet system according to claim 15, wherein the control-cabinet system comprises a plurality of functional modules which are attached to the base module,
wherein the openings are covered by the functional modules or are covered by the functional modules and cover, and
wherein the control-cabinet system consisting of base module and functional modules is dust-tight and liquid-tight.

18. The control-cabinet system according to claim 15, wherein the module housing comprises at least one seal.

19. The control-cabinet system according to claim 15, wherein
the module housing comprises a first module housing face and further module housing faces, and
wherein the first module housing face comprises a module housing opening, wherein the first module housing face is flat.

20. A functional module having:
a module housing,
an electronic circuit and
at least one module connection element, the module connection element being configured to engage with a connection element of a base module,
the module housing having a first module housing face and further module housing faces, the first module housing face having a module housing opening, the first module housing face being flat, wherein the module connection element is further configured to engage the low voltage connections.

* * * * *